(12) United States Patent
Kim et al.

(10) Patent No.: US 11,501,846 B2
(45) Date of Patent: Nov. 15, 2022

(54) SEMICONDUCTOR MEMORY DEVICE, METHOD OF TESTING THE SAME AND TEST SYSTEM

(71) Applicant: SAMSUNG ELECTRONICS CO., LTD., Suwon-si (KR)

(72) Inventors: Sanglok Kim, Seoul (KR); Youngdon Choi, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 17/239,651

(22) Filed: Apr. 25, 2021

(65) Prior Publication Data
US 2022/0076778 A1   Mar. 10, 2022

(30) Foreign Application Priority Data
Sep. 9, 2020  (KR) .................. 10-2020-0115129

(51) Int. Cl.
*G11C 29/56*   (2006.01)

(52) U.S. Cl.
CPC .. *G11C 29/56004* (2013.01); *G11C 29/56008* (2013.01); *G11C 29/56012* (2013.01); *G11C 2029/5602* (2013.01)

(58) Field of Classification Search
None
See application file for complete search history.

(56) References Cited

U.S. PATENT DOCUMENTS

| | | | |
|---|---|---|---|
| 7,664,888 B2 | 2/2010 | Tran et al. | |
| 7,793,174 B2 | 9/2010 | Hattori et al. | |
| 8,773,932 B2 | 7/2014 | Chen et al. | |
| 9,881,693 B2 | 1/2018 | Kondo et al. | |
| 2004/0078608 A1* | 4/2004 | Kanapathippillai | G06F 9/383 713/300 |
| 2005/0156616 A1* | 7/2005 | Morishita | G11C 29/48 324/754.03 |
| 2006/0125508 A1* | 6/2006 | Glidden, III | G06K 19/0723 324/754.03 |

(Continued)

FOREIGN PATENT DOCUMENTS

| | | |
|---|---|---|
| JP | 2735010 A | 1/1998 |
| JP | 20010110200 A | 4/2001 |
| KR | 10-586071 A | 5/2006 |

*Primary Examiner* — Guerrier Merant
(74) *Attorney, Agent, or Firm* — Volentine, Whitt & Francos, PLLC

(57) ABSTRACT

A semiconductor memory device included in each of a plurality of chips which are divided by a scribe lane and formed on an upper surface of a wafer, includes a memory core and a built-in self test (BIST) circuit. The memory core includes a memory cell array that stores data and a data input/output circuit connected to a data input/output pad. The BIST circuit is connected to a test pad that is separate from the data input/output pad. The BIST circuit generates test pattern data including first parallel bits based on commands and addresses received from an external automatic test equipment (ATE) during a wafer level test process performed on the semiconductor memory device. The BIST circuit tests the memory core by applying the test pattern data to the memory cell array through the data input/output circuit.

19 Claims, 18 Drawing Sheets

(56) References Cited

U.S. PATENT DOCUMENTS

| | | | |
|---|---|---|---|
| 2010/0162056 A1* | 6/2010 | Higashino | G11C 29/02 |
| | | | 714/718 |
| 2010/0195396 A1 | 8/2010 | Higuchi | |
| 2014/0032826 A1* | 1/2014 | Lee | G06F 12/00 |
| | | | 711/104 |
| 2018/0374555 A1* | 12/2018 | Kwon | G11C 29/12015 |
| 2021/0304834 A1* | 9/2021 | Tang | G11C 16/30 |

* cited by examiner

FIG. 11

| DATA RATE [Mbps] | PA10-PA17 | PA20-PA23 | PA30-PA31 | SA |
|---|---|---|---|---|
| | 150 | 300 | 600 | 1200 |

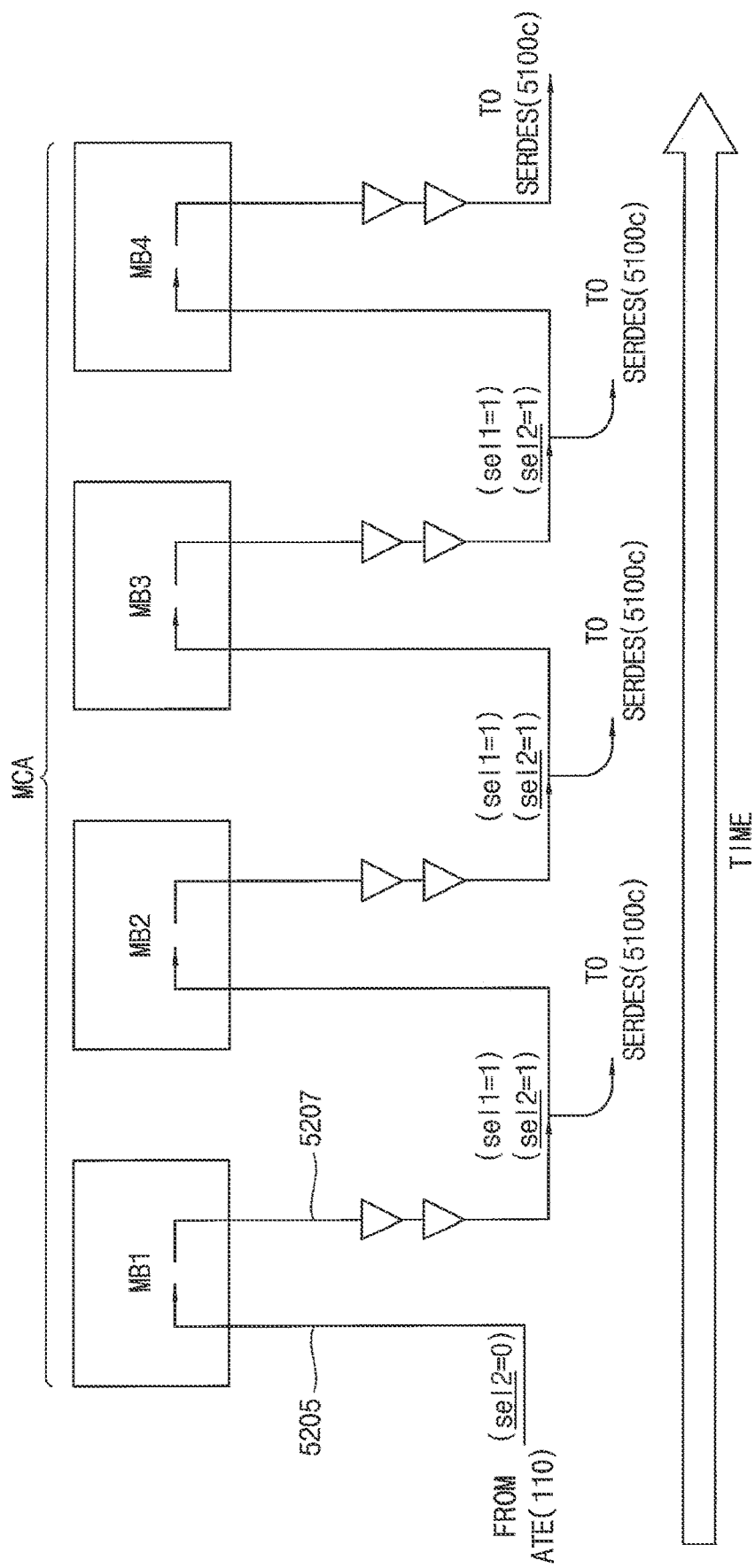

SEMICONDUCTOR MEMORY DEVICE, METHOD OF TESTING THE SAME AND TEST SYSTEM

CROSS-REFERENCE TO RELATED APPLICATION

A claim of priority under 35 USC § 119 is made to Korean Patent Application No. 10-2020-0115129, filed on Sep. 9, 2020, in the Korean Intellectual Property Office (KIPO), the entirety of which is hereby incorporated by reference.

BACKGROUND

The present disclosure relates generally to semiconductor integrated circuits, and more particularly to semiconductor memory devices, methods of testing semiconductor memory devices and test systems.

Semiconductor memory devices for storing data may be broadly classified into volatile semiconductor memory devices and nonvolatile semiconductor memory devices. In volatile semiconductor memory devices such as dynamic random access memory (DRAM), data is stored by charging or discharging cell capacitors and the stored data is maintained while power is applied. However, the stored data is lost when power is cut off. In contrast, nonvolatile memory devices may retain stored data even when power is cut off.

In a process of manufacturing semiconductor memory devices, a wafer level process, a package level process and a post package level process may be performed. The wafer level process corresponds to processes of producing a wafer including the semiconductor memory device. Built-in self tests (BISTs) may be performed to test the semiconductor memory device during the wafer level process. However, when a BIST is performed by connecting external automatic test equipment (ATE) directly to a data input/output pad of a semiconductor memory device, an execution speed and application range of the BIST may be limited due to a load effect generated by the ATE.

SUMMARY

Embodiments of the inventive concepts may provide a semiconductor memory device, a method of testing the semiconductor memory device and a test system, capable of efficiently performing a built-in self test (BIST) in wafer level processing of semiconductor memory devices.

Embodiments of the inventive concepts provide a semiconductor memory device including a memory core and a BIST circuit. The memory core includes a memory cell array that stores data, and a data input/output circuit connected to a data input/output pad. The BIST circuit is connected to a test pad that is disposed separate from the data input/output pad. The BIST circuit generates test pattern data including first parallel bits based on commands and addresses received from external automatic test equipment (ATE) during a wafer level test process performed on the semiconductor memory device. The BIST circuit tests the memory core by applying the test pattern data to the memory cell array through the data input/output circuit. The semiconductor memory device is disposed in a chip from among a plurality of chips that are on a surface of a wafer and that are separated from each other by a scribe lane.

Embodiments of the inventive concepts further provide a method of testing semiconductor memory devices including receiving commands and addresses from outside through a test pad that is separate from data input/output pads that are connected to data input/output circuits of the semiconductor memory devices; generating test pattern data including parallel bits based on the commands and the addresses; and testing memory cores of the semiconductor memory devices by applying the test pattern data is applied to memory cell arrays of the memory cores through the data input/output circuits. The semiconductor memory devices are included in each of a plurality of chips that are on a surface of a wafer and that are separated from each other by a scribe lane.

Embodiments of the inventive concepts still further provide a test system including an ATE and a semiconductor memory device. The ATE generates commands and addresses in a first test mode of a wafer level test performed on a semiconductor memory device included in a chip from among a plurality of chips that are on an upper surface of a wafer. The ATE generates the commands, the addresses and external test pattern data in a second test mode of the wafer level test. The semiconductor memory device includes a memory core and a BIST circuit. The memory core includes a memory cell array that stores data, and a data input/output circuit connected to a data input/output pad. The BIST circuit is connected to a test pad that is separate from the data input/output pad. The BIST circuit generates test pattern data including first parallel bits responsive to the commands and the addresses from the ATE in the first test mode. The BIST circuit receives the commands, the addresses and the external test pattern data, and tests the memory core by applying one of the test pattern data and the external test pattern data to the memory cell array through the data input/output circuit in the second test mode.

Embodiments of the inventive concepts also provide a method of manufacturing semiconductor memory devices including forming the semiconductor memory devices in each of a plurality of chips that are on an upper surface of a wafer and that are separated from each other by a scribe lane; and testing the semiconductor memory devices. The testing including receiving commands and addresses from outside of the semiconductor memory devices through a test pad separated from data input/output pads that are connected to data input/output circuits of the semiconductor memory devices, generating test pattern data including parallel bits based on the commands and the addresses, and testing memory cores of the semiconductor memory devices by applying the test pattern data to memory cell arrays of the memory cores through the data input/output circuits.

The semiconductor memory device, the method of testing the semiconductor memory device and the test system of the embodiments of the inventive concepts perform wafer level tests through a test pad separate from a data input/output pad connected to a data input/output circuit. As a result, since a load effect generated by automatic test equipment does not affect an input buffer and an output driver that may be a target of the wafer level tests, the wafer level tests may be performed at high speed. Further, the semiconductor memory device and the test system include a serializer/deserializer (SERDES) connected to the test pad. The SERDES performs serial-parallelization on data input/output through the test pad, and thereby enables the wafer level tests to be performed using a single test pad.

BRIEF DESCRIPTION OF THE DRAWINGS

Example embodiments of the inventive concepts will be more clearly understood from the following detailed description of embodiments taken in conjunction with the accompanying drawings.

FIG. 11 illustrates a diagram descriptive of a data rate of data passing through a serializer or a parallelizer illustrated in FIG. 8.

FIGS. 14A and 14B illustrate examples of a method of testing a semiconductor memory device illustrated of FIG. 13.

DETAILED DESCRIPTION OF THE EMBODIMENTS

Figure 1:
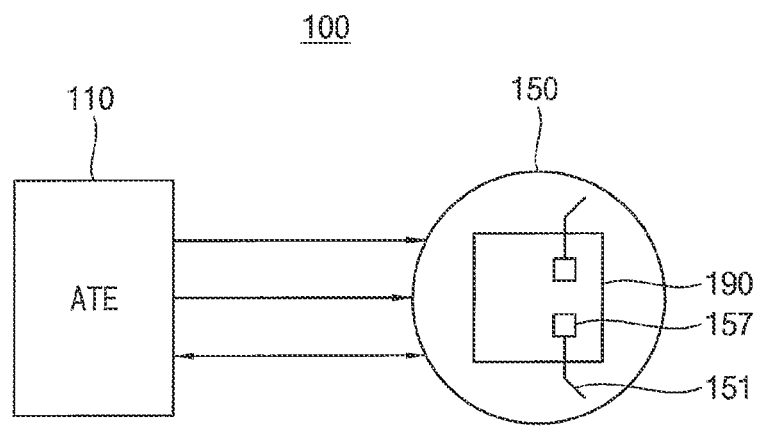
FIG. 1 illustrates a block diagram of a test system according to embodiments of the inventive concepts.

Various example embodiments will be described more fully hereinafter with reference to the accompanying drawings. In the drawings, like numerals refer to like elements throughout. Repeated descriptions may be omitted.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 2:
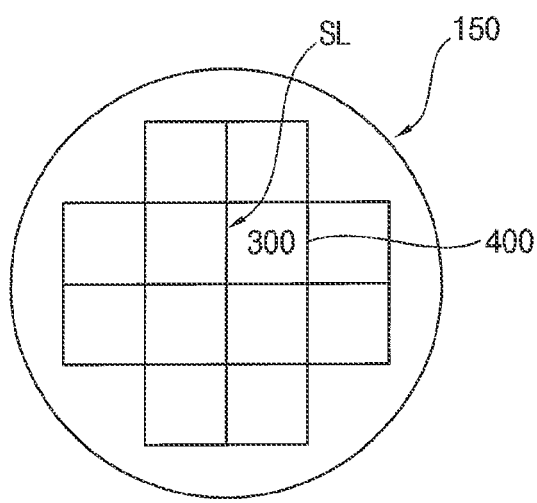
FIG. 2 illustrates a plan view of a wafer and a test structure of FIG. 1.

FIG. 1 illustrates a block diagram of a test system according to embodiments of the inventive concepts. FIG. 2 illustrates a plan view of a wafer and a test structure of FIG. 1.

Referring to FIGS. 1 and 2, a test system 100 includes an automatic test equipment (ATE) 110, a wafer 150, a test structure 190 formed on the wafer 150, probes 151 and common chip pads 157. The test structure 190 includes a plurality of chips 300, and the plurality of chips 300 includes semiconductor memory devices.

The ATE 110 performs various tests, hereinafter referred to as 'wafer level test(s)', on the semiconductor memory devices during wafer level processing or between wafer level processing and package level processing.

In some embodiments, tests performed by the ATE 110 may include a direct current (DC) test, an alternating current (AC) test and a function test. The DC test for example tests DC characteristics of the semiconductor memory devices by applying a DC voltage to the semiconductor memory devices. The DC characteristics may include whether the semiconductor memory devices are open or shorted, and a magnitude of input/output current and voltage. The AC test for example tests AC characteristics of the semiconductor memory devices by applying an AC voltage to the semiconductor memory devices. The AC characteristics may include input/output start time, end time and delay time of the semiconductor memory devices. The function test for example tests functional characteristics of the semiconductor memory devices by applying test pattern data or the like to the semiconductor memory devices. The functional characteristics may include write and read performance of the semiconductor memory devices, and data transmission performance through paths formed in a process of testing the write and read performance, and the like.

In some embodiments, the ATE 110 may generate commands and addresses to perform the DC test, the AC test and the function test. Furthermore, the ATE 110 may further generate test pattern data to perform the DC test and the AC test.

In some embodiments, the ATE 110 may provide commands, addresses and test pattern data to the semiconductor memory devices through probes 151 and common chip pads 157.

However, unlike in the DC test and the AC test, the ATE 110 does not generate the test pattern data during a process of performing the function test. In some embodiments, the test pattern data required in the process of performing the function test may be generated by a built-in self test (BIST) circuit included in the semiconductor memory devices rather than the ATE 110, as will be described later with reference to FIG. 3. As such, the function test may be distinguished from the DC test and the AC test. An operation mode for performing the function test may be referred to as a first test mode, and an operation mode for performing the DC test and the AC test may be referred to as a second test mode.

The ATE 110 may perform tests on a plurality of test items in each of a plurality of test modes including the first test mode and the second test mode. In some embodiments, a portion of the plurality of tests may be performed by the BIST circuit described later with reference to FIG. 3, 4, 5, 6, 8 or 13.

As a result of tests performed by the ATE 110, it is determined whether the semiconductor memory devices are defective. All or a portion of the plurality of chips 300 including the semiconductor memory devices are selected according to the determination result. The selected chips 300 are divided by a scribe lane SL, and may be manufactured as individual unit chips or packages through the package level process.

A total of twelve chips 300 are illustrated in FIG. 2, but the number of the plurality of chips 300 is merely exemplary. In various embodiments the wafer may include any number of chips 300. A portion 400 of the plurality of chips 300 will be described later with reference to FIG. 5.

Figure 3:
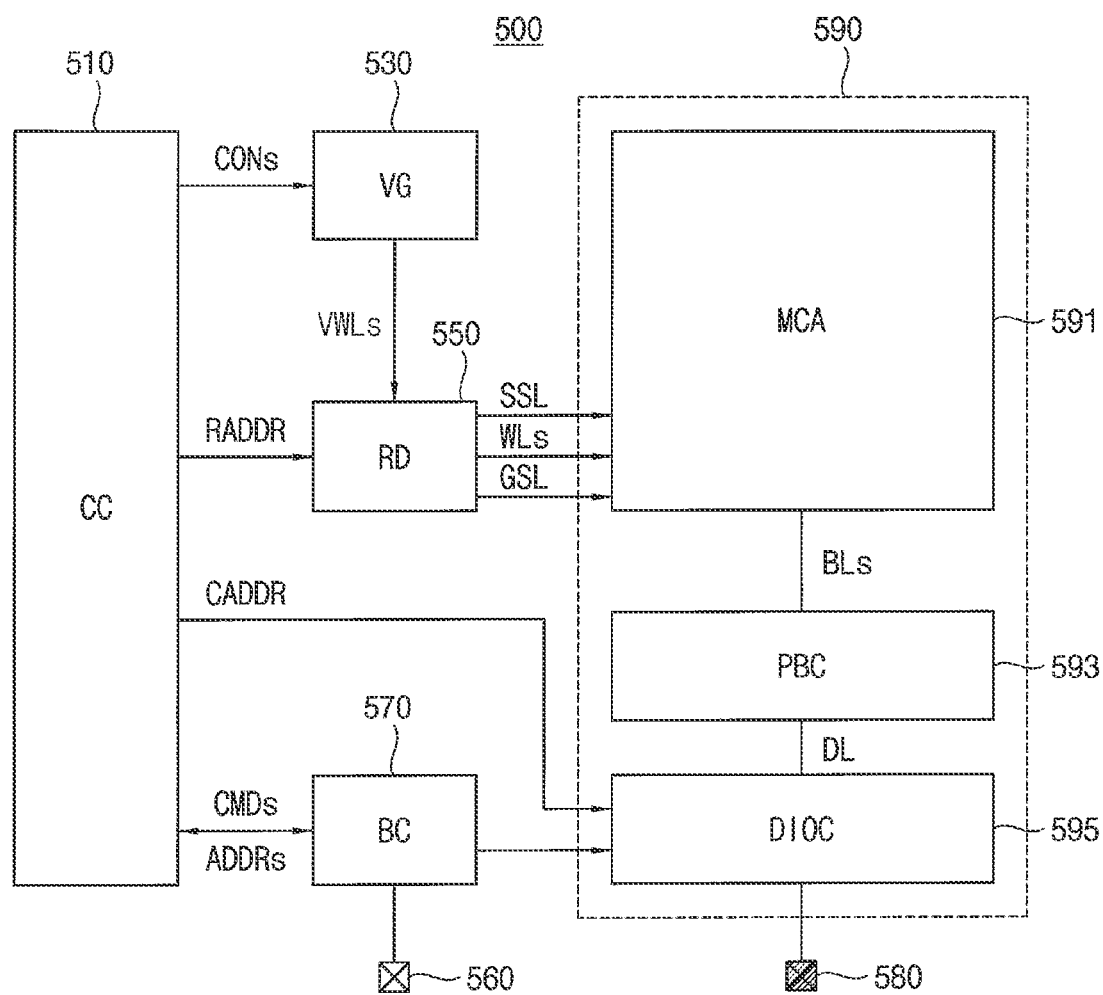
FIG. 3 illustrates a block diagram of a semiconductor memory device included in one of a plurality of chips of FIG. 2.

FIG. 3 illustrates a block diagram of a semiconductor memory device included in one of a plurality of chips of FIG. 2.

In FIG. 3, the semiconductor memory device is illustrated as a nonvolatile memory device. However, this is merely exemplary and in other embodiments the semiconductor memory device may be a volatile memory device.

Referring to FIGS. 1 to 3, the semiconductor memory device 500 includes a control circuit (CC) 510, a voltage generator (VG) 530, a row decoder (RD) 550, a built-in self test (BIST) circuit (BC) 570, a test pad 560, a data input/output pad 580 and a memory core 590. The memory core 590 includes a memory cell array (MCA) 591, a page buffer circuit (PBC) 593, and a data input/output circuit (DIOC) 595.

The memory cell array 591 is coupled to the row decoder 550 through a string selection line SSL, a plurality of word lines WLs and a ground select line GSL. The memory cell array 591 is further coupled to the page buffer circuit 593 through a plurality of bit lines BLs. In some embodiments more than one string selection line and/or more than one ground selection line GSL may be included.

In some embodiments, the memory cell array 591 may include a plurality of memory blocks, and each memory block may include a plurality of nonvolatile memory cells coupled to a plurality of word lines WLs and a plurality of bit lines BLs.

In some embodiments, the memory cell array 591 may be a two dimensional memory cell array formed as a two dimensional structure (or a horizontal structure) on a substrate. For example, the memory cell array 591 may include string select transistors, ground select transistors and memory cells. The string select transistors may be coupled to bit lines, and the ground select transistors may be coupled to a common source line. The memory cells in the same string may be arranged in series between a corresponding one of the bit lines and the common source line. The memory cells in the same row may be coupled to a corresponding one of word lines. Thus, the memory cells may be coupled in series between the string select transistors and the ground select transistors, and, for example, 16, 32 or 64 word lines may be disposed between a string select line SSL and a ground select line GSL. The string select transistors may be coupled to the string select line SSL, and may be controlled according to a level of a voltage applied to the string select line SSL. The ground select transistors may be coupled to the ground select line GSL, and may be controlled according to a level of a voltage applied to the ground select line GSL. The memory cells may be controlled according to levels of voltages applied to the word lines WL. A first nonvolatile memory including the memory cell array 591 may perform a write (or program) operation and a read operation on a page basis, and may perform an erase operation on a block basis.

In other example embodiments, the memory cell array 591 may be a three dimensional memory cell array formed as a three dimensional structure (or a vertical structure) on a substrate. The following patent documents, which are hereby incorporated by reference in their entirety, describe suitable configurations for a memory cell array including a 3D vertical array structure, in which the 3D memory array is configured as a plurality of levels, with word lines and/or bit lines shared between levels: U.S. Pat. Nos. 7,679,133; 8,553,466; 8,654,587; and 8,559,235, and US Pat. Pub. No. 2011/0233648.

Although examples of the semiconductor memory device 500 according to example embodiments are described based on NAND flash memory, the semiconductor memory device 500 may be any nonvolatile memory device, e.g., phase random access memory (PRAM), resistive random access memory (RRAM), nano floating gate memory (NFGM), polymer random access memory (PoRAM), magnetic random access memory (MRAM), ferroelectric random access memory (FRAM), thyristor random access memory (TRAM), among various other types of nonvolatile memory.

The BIST circuit 570 performs, in a process of performing a wafer level test, a portion of functions performed by the control circuit 510 after the wafer level process, the package level process and the post package level process are all performed on the semiconductor memory device 500 and the semiconductor memory device is mounted in an electronic device.

More specifically, the BIST circuit 570 receives commands CMDs, addresses ADDRs and test pattern data from the ATE illustrated in FIG. 1, and provides commands CMDs and addresses ADDRs to the control circuit 510. As described above with reference to FIGS. 1 and 2, the ATE 110 may perform the DC test, the AC test and the function test, and may further generate the test pattern data in a process of performing the DC test and the AC test.

That is, the BIST circuit 570 receives commands CMDs, addresses ADDRs and the test pattern data from the ATE 110 in the process of performing the DC test and the AC test, provides commands CMDs and addresses ADDRs to the control circuit 510 and provides the test pattern data to the data input/output circuit 595. The BIST circuit 570 receives commands CMDs and addresses ADDRs from the ATE 110 in the process of performing the function test, generates the test pattern data internally in the BIST circuit 570, and provides commands CMDs and addresses ADDRs to the control circuit 510 and provides the test pattern data to the data input/output circuit 595.

The BIST circuit 570 is connected to the test pad 560. The BIST circuit 570 receives commands CMDs, addresses ADDRs and the test pattern data through the test pad 560 that is separated from the data input/output pad 580.

The control circuit 510 receives commands CMDs and addresses ADDRs from the BIST circuit 570, and controls the row decoder 550, the page buffer circuit 593, the data input/output circuit 595 and the voltage generator 530 based on commands CMDs and addresses ADDRs to perform write (or program), read and erase operations for the memory cell array 591.

In some embodiments, the control circuit 510 may provide a row address RADDR to the row decoder 550 and a column address CADDR to the data input/output circuit 595. The row decoder 550 may be connected to the memory cell array 591 via the string selection line, the plurality of word lines and the ground selection line. The row decoder 550 may determine at least one of the plurality of word lines as a selected word line, and may determine the rest of the plurality of word lines as unselected word lines, based on the row address RADDR.

The voltage generator 530 may generate word line voltages that are required for an operation of the semiconductor memory device 500 based on the control signals CONs. The word line voltages VWLs may be applied to the plurality of word lines via the row decoder 550. For example, during an erase operation, the voltage generator 530 may provide an erase voltage to be applied to a well or a common source line of a memory block, and may provide a ground voltage to be applied to all word lines of the memory block. During an erase verification operation, the voltage generator 530 may provide an erase verification voltage to be applied to all of the word lines of the memory block, or may provide the erase verification voltage to be sequentially applied to the word lines of the memory block on a word line-by-word line basis. During a program operation (or a write operation), the voltage generator 530 may provide a program voltage to be applied to a selected word line, and may provide a program pass voltage to be applied to unselected word lines. During a program verification operation, the voltage generator 530 may provide a program verification voltage to be applied to a selected word line, and may provide a verification pass voltage to be applied to unselected word lines. During a read operation, the voltage generator 530 may provide a read voltage to be applied to a selected word line, and may provide a read pass voltage to be applied to unselected word lines.

The page buffer circuit 593 may be connected to the memory cell array 591 via the plurality of bit lines BLs. The page buffer circuit 593 may include a plurality of page buffers. In some example embodiments, each page buffer may be connected to one bit line. In other example embodiments, each page buffer may be connected to two or more bit lines. The page buffer circuit 593 may store data to be programmed into the memory cell array 591, or may read data sensed from the memory cell array 591. In other words, the page buffer circuit 593 may operate as a write driver or a sensing amplifier according to an operation mode of the semiconductor memory device 500.

The data I/O circuit 595 may be connected to the page buffer circuit 593 via a data line DL. The data I/O circuit 595 may provide data from an outside of the semiconductor memory device 500 to the memory cell array 591 via the page buffer circuit 593, or may provide data from the memory cell array 591 to the outside of the semiconductor memory device 500, based on the column address CADDR.

Figure 4:
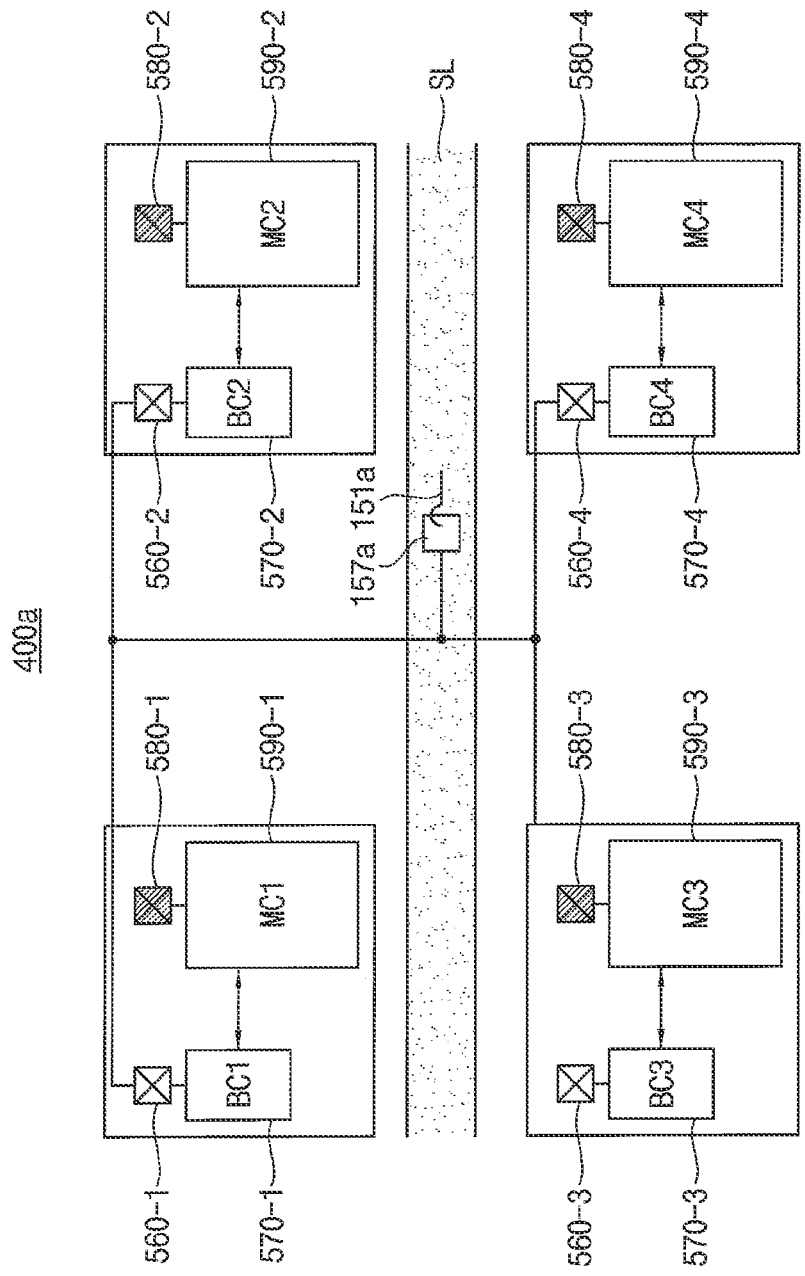
FIG. 4 illustrates a block diagram of a connection relationship between semiconductor memory devices included in a portion of a plurality of chips and a common chip pad in FIG. 2.

FIG. 4 illustrates a block diagram of a connection relationship between semiconductor memory devices included in a portion of a plurality of chips and a common chip pad illustrated in FIG. 2.

In FIG. 4, a portion 400a of a plurality of chips is illustrated. The portion 400a of the plurality of chips may include four chips, one probe 151a and one common chip pad 157a. A first chip of the four chips includes a memory core (MC1) 590-1, a built-in self test (BIST) circuit (BC1) 570-1, a test pad 560-1 and a data input/output pad 580-1. A second chip of the four chips includes a memory core (MC2) 590-2, a BIST circuit (BC2) 570-2, a test pad 560-2 and a data input/output pad 580-2. A third chip of the four chips includes a memory core (MC3) 590-3, a BIST circuit (BC3) 570-3, a test pad 560-3 and a data input/output pad 580-3. A fourth chip of the four chips includes a memory core (MC4) 590-4, a BIST circuit (BC4) 570-4, a test pad 560-4 and a data input/output pad 580-4. Each of the first through fourth chips may include additional circuitry (not shown) such as described with respect to FIG. 3.

As described above with reference to FIGS. 1 to 3, each of the BIST circuits 570-1, 570-2, 570-3 and 570-4 may receive commands CMDs, addresses ADDRs and the test pattern data from the ATE 110 illustrated in FIG. 1. Each of the BIST circuits 570-1, 570-2, 570-3 and 570-4 may be connected to the probe 151a and the common chip pad 157a formed in a scribe lane SL to receive commands CMDs, addresses ADDRs and the test pattern data.

Meanwhile, each of the memory cores 590-1, 590-2, 590-3 and 590-4 illustrated in FIG. 4 is connected to one of data input/output pads 580-1, 580-2, 580-3 and 580-4. However, the data input/output pads 580-1, 580-2, 580-3 and 580-4 are not used during the wafer level test, and may be used only for providing/receiving commands, addresses and data to/from an external memory controller in a process of mounting and using the semiconductor memory device in an electronic device.

In FIG. 4, the portion 400a of the plurality of chips as shown includes four chips, one probe 151a and one common chip pad 157a, but the number of chips, probes 151a and common chip pads 157a is merely exemplary.

Figure 5:
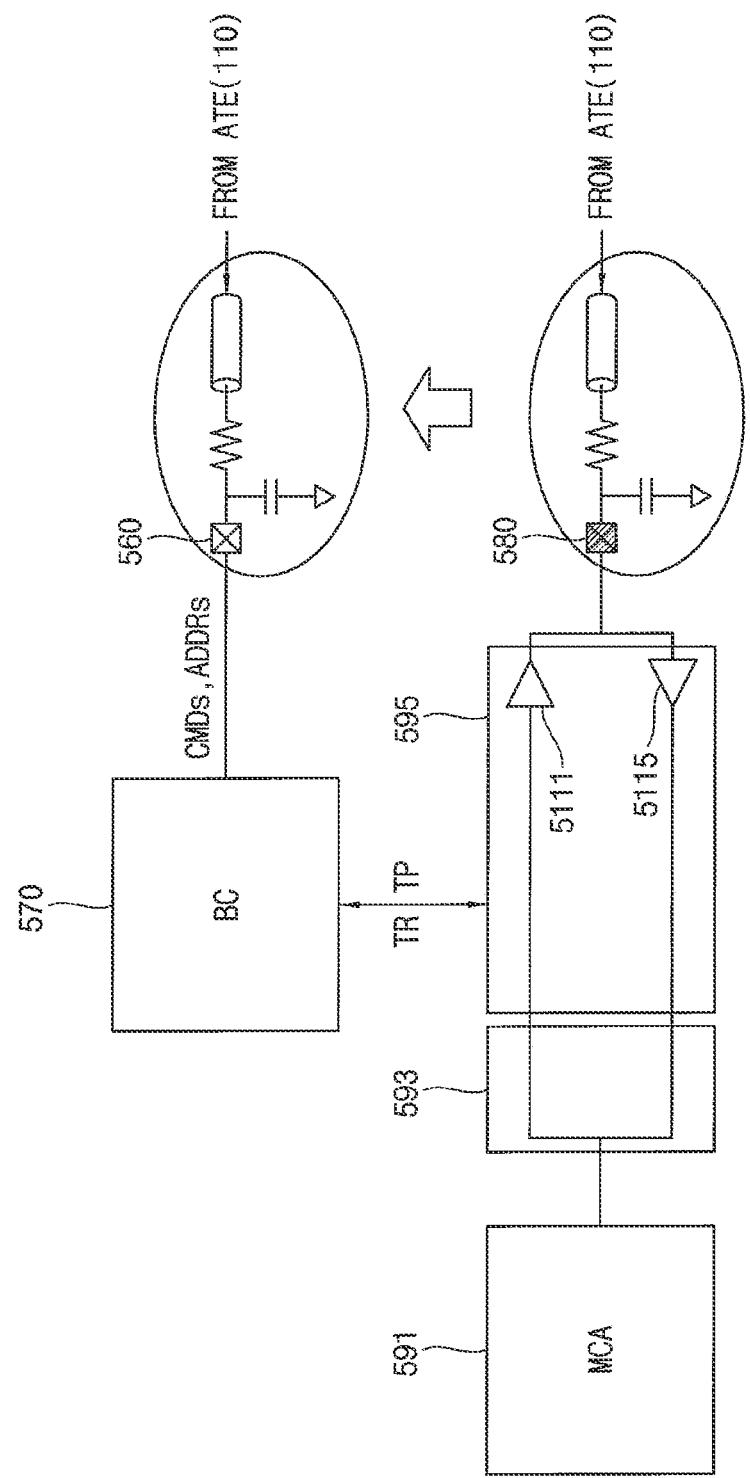
FIG. 5 illustrates a block diagram of a semiconductor memory device of FIG. 3 according to embodiments of the inventive concepts.

FIG. 5 illustrates a block diagram of a semiconductor memory device of FIG. 3, according to embodiments of the inventive concepts.

In FIG. 5, for convenience of description, a semiconductor memory device is shown as including only a memory cell array 591, a page buffer circuit 593, a data input/output circuit 595, a built-in self test (BIST) circuit 570, a test pad 560 and a data input/output pad 580 from among components included in the semiconductor memory device 500 illustrated in FIG. 3. Components having the same reference numerals as those included in the semiconductor memory device 500 illustrated in FIG. 3 perform the same or similar functions, and thus duplicate description may be omitted from the following.

Referring to FIGS. 1 to 5, a semiconductor memory device according to example embodiments includes a separate test pad 560 for performing wafer level test. The test pad 560 is connected to the BIST circuit 570 included in the semiconductor memory device and serves to mediate input/output of data between the ATE 110 and the BIST circuit 570.

In performing the wafer level tests, not only the memory cell array 591 but also components included in the data input/output circuit 595 may be included as a target of the wafer level tests. For example, an input buffer 5115 and an output driver 5111 included in the data input/output circuit 595 may be included as the object of the wafer level tests.

According to example embodiments, as the semiconductor memory device is connected to the ATE 110 through the test pad 560 instead of the data input/output pad 580, the load effect generated by the ATE 110 does not affect the input buffer 5115 and the output driver 5111 that may be the object of the wafer level tests.

In performing the wafer level test, a function test is performed based on test pattern data TP generated by the BIST circuit 570. When the test pattern data TP passes through various components included in the data input/output circuit 595, a data rate exceeds a maximum of 1000

Mbps. Therefore, when the semiconductor memory device is formed in a structure that transmits and receives data to and from the ATE 110 through the test pad 560 separately provided as described above, the input buffer 5115 and the output driver 5111 may be included as the object of the function test. Hereinafter, various examples of the semiconductor memory devices according to example embodiments will be described.

Figure 6:
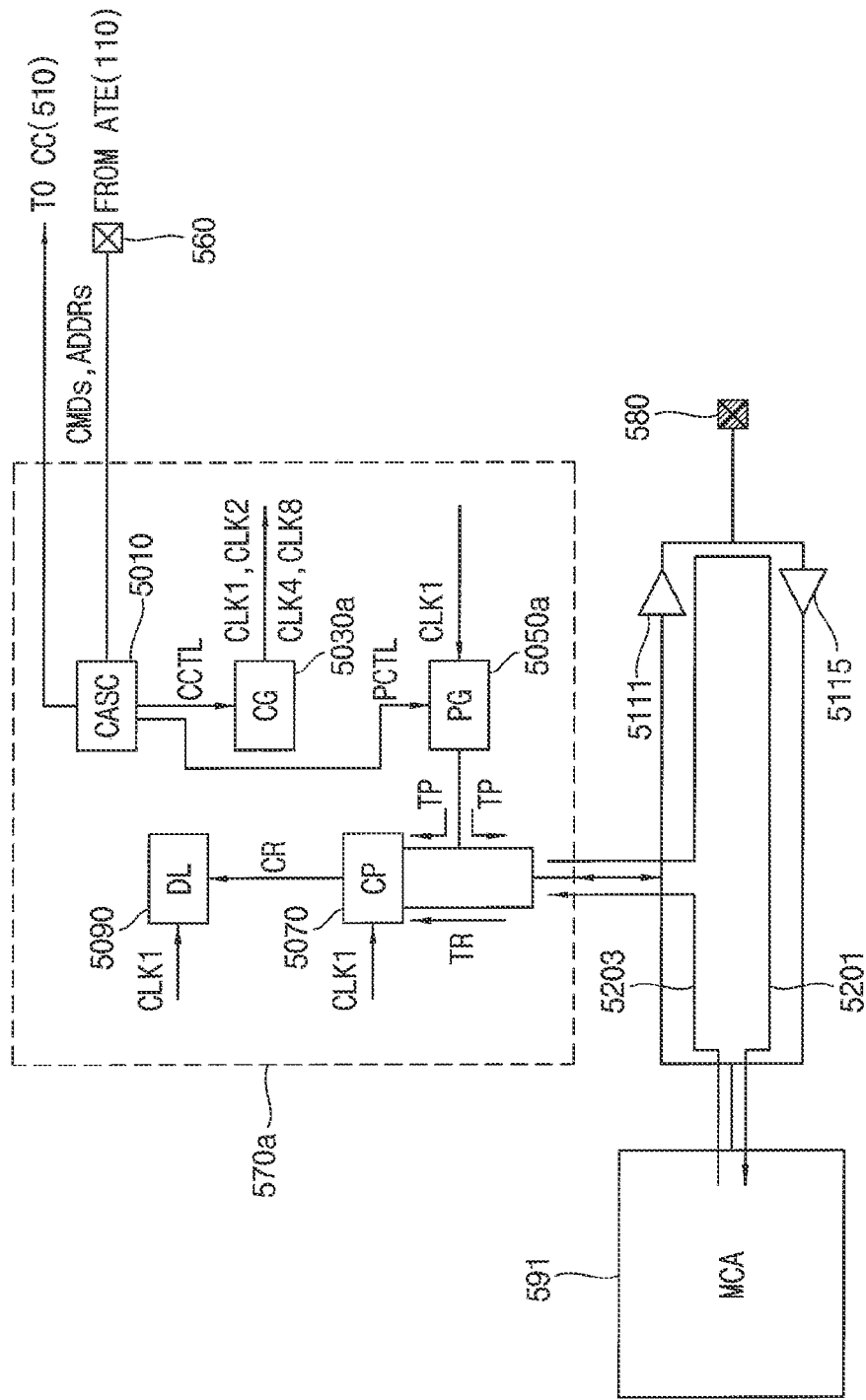
FIG. 6 illustrates a block diagram of a semiconductor memory device of FIGS. 3 and 5 according to embodiments of the inventive concepts.

FIG. 6 illustrates a block diagram of a semiconductor memory device of FIGS. 3 and 5 according to embodiments of the inventive concepts.

In FIG. 6, components having the same reference numerals as those included in the semiconductor memory device illustrated in FIG. 5 perform the same or similar functions, and thus duplicate description may be omitted from the following.

Referring to FIG. 6, a semiconductor memory device includes a memory cell array 591, a BIST circuit 570a, an input buffer 5115, an output driver 5111, a test pad 560 and a data input/output pad 580. The BIST circuit 570a includes a sampling circuit (CASC) 5010, a clock generator (CG) 5030a, a pattern generator (PG) 5050a, a comparison circuit (CP) 5070 and determination logic (DL) 5090.

The semiconductor memory device illustrated in FIG. 6 may perform a function test from among the wafer level test. As described above with reference to FIG. 5, the test pad 560 is connected to the ATE 110, but the data input/output pad 580 has no connection relationship and does not perform a specific function in performing the function test.

Referring to FIGS. 1, 5 and 6, the sampling circuit 5010 receives commands CMDs and addresses ADDRs from the ATE 110, and generates control signals PCTL and CCTL by sampling at least one of the commands CMDs and the addresses ADDRs. The commands CMDs and the addresses ADDRs will be described in more detail.

Figure 7:
FIG. 7 illustrates a diagram descriptive of commands and addresses input to a sampling circuit in FIG. 6.

FIG. 7 illustrates a diagram descriptive of commands and addresses input to a sampling circuit in FIG. 6.

Referring to FIG. 7, each of commands CMDs and addresses ADDRs may include serial bits received through a test pad. For example, the commands CMDs may include a first command CMD1, a second command CMD2 and a third command CMD3, and the addresses ADDRs may include a first address ADDR1, a second address ADDR2 and a third address ADDR3.

In an embodiment, the commands CMDs may include a write command, a read command and an erase command. However, in other embodiments, the commands CMDs may further include for example a chip enable signal, a command latch enable signal, an address latch enable signal, a write enable signal, a read enable signal, a data strobe signal, a data signal and a ready/busy signal.

In some embodiments, a control signal PCTL may be a signal that controls a pattern generator 5050a, and a control signal CCTL may be a signal that controls a clock generator 5030a.

The clock generator 5030a receives the control signal CCTL from a sampling circuit 5010 and generates a plurality of clock signals CLK1, CLK2, CLK4 and CLK8 having different frequencies with respect to each other based on the control signal CCTL.

In some embodiments, the clock generator 5030a may provide one CLK1 of the plurality of clock signals CLK1, CLK2, CLK4 and CLK8 to the pattern generator 5050a, the comparison circuit 5070 and the determination logic 5090.

The pattern generator 5050a generates the test pattern data TP in response to the commands CMDs and addresses ADDRs. In some embodiments, the pattern generator 5050a may receive the control signal PCTL from the sampling circuit 5010 and the clock signal CLK1 from the clock generator 5030a, and may generate the test pattern data TP based on the control signal PCTL and the clock signal CLK1. The test pattern data TP may include parallel bits. The test pattern data TP may be applied to the memory cell array 591 through a data input/output circuit (e.g., 595 of FIG. 5) and may be used to test a memory core including the memory cell array 591. After the test pattern data TP is written in the memory cell array 591, data read from the memory cell array 591 may be referred to as test result data TR.

The comparison circuit 5070 compares the test result data TR outputted from the memory cell array 591 in response to the test pattern data TP with the test pattern data TP to generate comparison signals CR.

The determination logic 5090 determines pass or fail of the test on the memory core based on the comparison signals CR. In an embodiment, the determination logic 5090 may be circuitry including for example logic gates or the like.

In FIG. 6, a plurality of paths 5201 and 5203 are illustrated. The path 5201 represents a path in which the test pattern data TP is generated from the pattern generator 5050a and is written to the memory cell array 591. The path 5203 represents a path in which the test result data TR is read from the memory cell array 591 and is transmitted to the comparison circuit 5070. In some embodiments, the output driver 5111 and the input buffer 5115 may be included on the path 5203.

Figure 8:
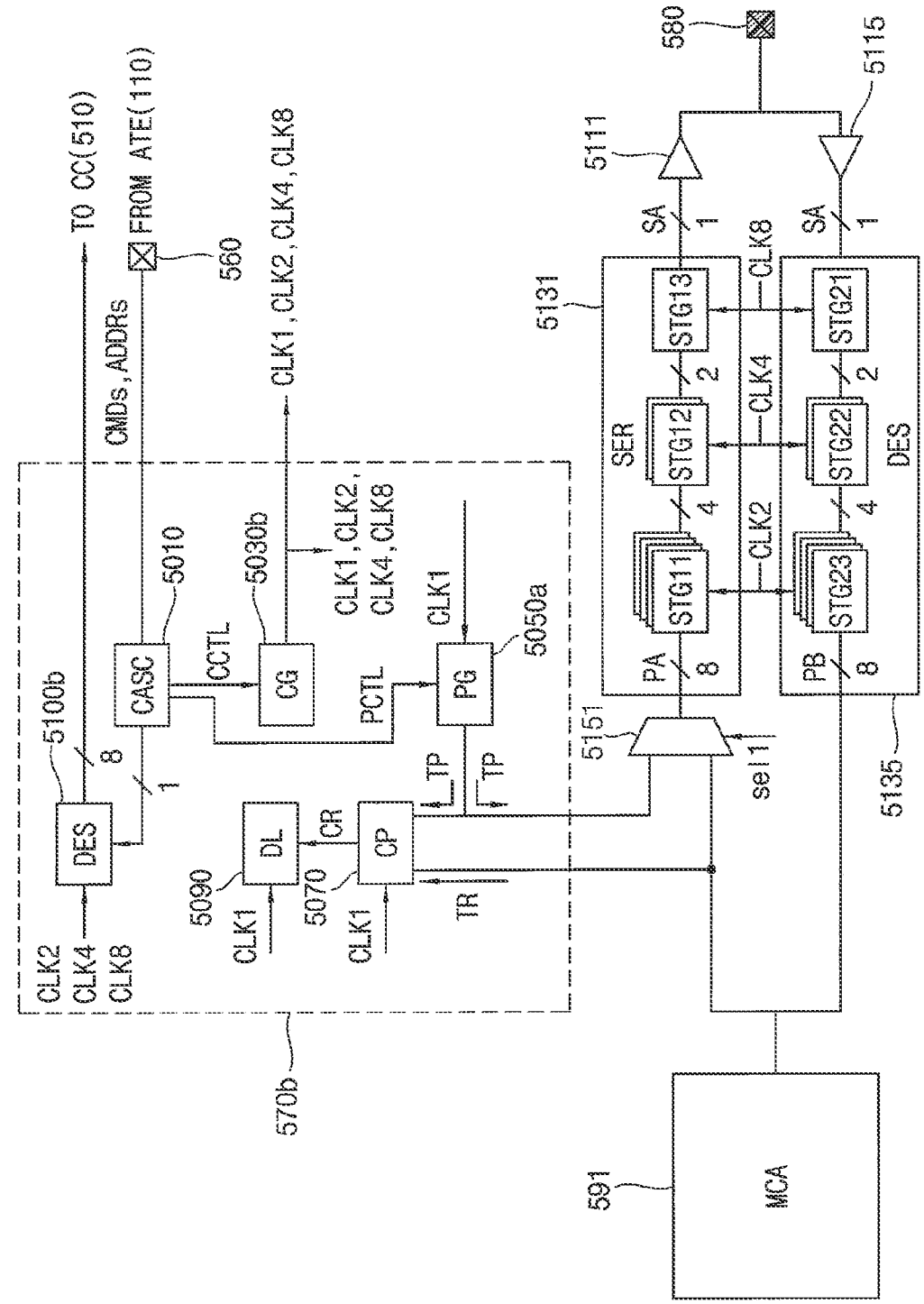
FIG. 8 illustrates a block diagram of a semiconductor memory device of FIGS. 3 and 6 according to embodiments of the inventive concepts.

FIG. 8 illustrates a block diagram of a semiconductor memory device of FIGS. 3 and 6 according to embodiments of the inventive concepts.

In FIG. 8, components having the same reference numerals as those included in the semiconductor memory device illustrated in FIGS. 3 and 6 perform the same or similar functions, and thus duplicate description will be omitted from the following.

Referring to FIG. 8, a semiconductor memory device includes a memory cell array 591, a BIST circuit 570b, a multiplexer 5151, a serializer 5131, an output driver 5111, an input buffer 5115, a parallelizer 5135, a test pad 560 and a data input/output pad 580.

The BIST circuit 570b includes a sampling circuit 5010, a clock generator 5030b, a pattern generator 5050a, a comparison circuit 5070, determination logic 5090 and a parallelizer 5100b.

The semiconductor memory device illustrated in FIG. 8 may perform a function test from among the wafer level test. As described above with reference to FIG. 6, the test pad 560 is connected to the ATE 110, but the data input/output pad 580 has no connection relationship and does not perform a specific function in performing the function test.

Referring to FIGS. 1, 6 and 8, the sampling circuit 5010 receives commands CMDs and addresses ADDRs from the ATE 110, and generates control signals PCTL and CCTL by sampling at least one of the commands CMDs and the addresses ADDRs. The sampling circuit 5010 provides the commands CMDs and the addresses ADDRs to the parallelizer 5100b.

The parallelizer 5100b receives the commands CMDs and the addresses ADDRs, and receives a plurality of clock signals CLK2, CLK4 and CLK8 from the clock generator 5030b. The parallelizer 5100b parallelizes (i.e., deserializes) the commands CMDs and addresses ADDRs based on the plurality of clock signals CLK2, CLK4 and CLK8 to provide the commands CMDs and addresses ADDRs to the control circuit 260 in parallel. A detailed configuration and operation of the parallelizer 5100b will be described later.

The clock generator 5030b receives the control signal CCTL from the sampling circuit 5010 and generates a plurality of clock signals CLK1, CLK2, CLK4 and CLK8 having different frequencies with respect to each other based on the control signal CCTL. In some embodiments, the clock generator 5030b may provide one CLK1 from among the plurality of clock signals CLK1, CLK2 CLK4 and CLK8 to the pattern generator 5050a, the comparison circuit 5070 and the determination logic 5090. The clock generator 5030b may provide clock signals CLK2, CLK4 and CLK8 from among the plurality of clock signals CLK1, CLK2 CLK4 and CLK8 to the parallelizer 5100b included in the BIST circuit 570b, and the serializer 5131 and the parallelizer 5135 included in the data input/output circuit. That is, some of the clock signals from among the plurality of clock signals CLK1, CLK2 CLK4 and CLK8 may be provided the parallelizer 5100b, the serializer 5131 and the parallelizer 5135.

The pattern generator 5050a generates test pattern data TP in response to the commands CMDs and the addresses ADDRs. In some embodiments, the pattern generator 5050a may receive the control signal PCTL from the sampling circuit 5010 and the clock signal CLK1 from the clock generator 5030b, and generate the test pattern data TP based on the control signal PCTL and the clock signal CLK1. The test pattern data TP may include parallel bits.

The comparison circuit 5070 compares test result data TR outputted from the memory cell array 591 in response to the test pattern data TP with the test pattern data TP to generate comparison signals CR.

The determination logic 5090 determines pass or fail of the test on the memory core based on the comparison signals CR.

In FIG. 8, the multiplexer 5151, the serializer 5131 and the parallelizer 5135 are positioned on paths corresponding to the plurality of paths 5201 and 5203 illustrated in FIG. 7.

The multiplexer 5151 selects one of the test pattern data TP and the test result data TR in response to the first selection signal sel1. The selection signal sel1 may be provided as a command from the control circuit 510 shown in FIG. 3.

The serializer 5131 receives one of the test pattern data TP and the test result data TR from the multiplexer 5151, and a plurality of clock signals CLK2, CLK4 and CLK8 from the BIST circuit 570b. The serializer 5131 serializes one of first parallel bits PA from among the test pattern data TP and the test result data TR based on the plurality of clock signals CLK2, CLK4 and CLK8 to output first serial bits SA having a first data rate.

The parallelizer 5135 receives the first serial bits SA from the serializer 5131 via the output driver 5111 and the input buffer 5115, and receives a plurality of clock signals CLK2, CLK4 and CLK8 from the BIST circuit 570b. The parallelizer 5135 parallelizes the first serial bits SA based on the plurality of clock signal CLK2, CLK4 and CLK8 to output second parallel bits PB having a second data rate. Hereinafter, the serializer 5131 will be described in more detail.

Figure 9:
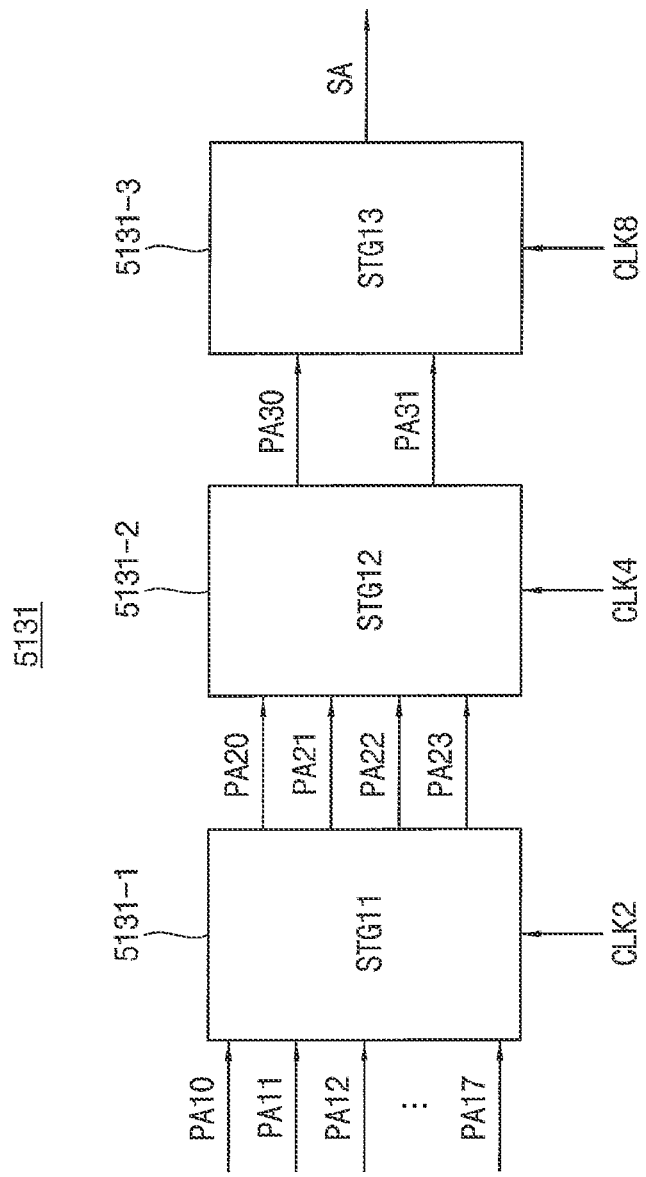
FIG. 9 illustrates a block diagram of a serializer illustrated in FIG. 8.
Figure 10:
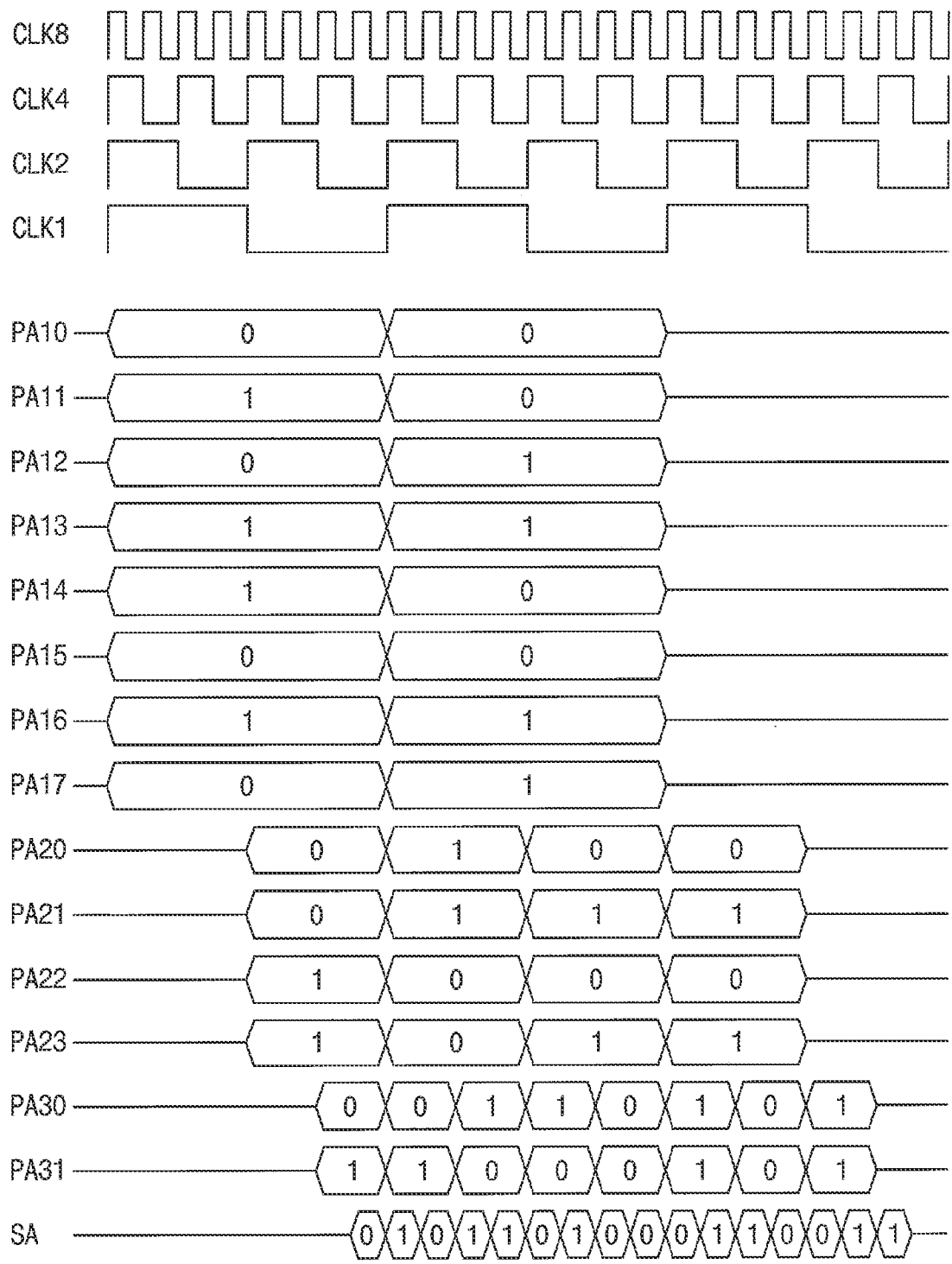
FIG. 10 illustrates a timing diagram of an operation of a serializer illustrated in FIG. 9.

FIG. 9 illustrates a block diagram of the serializer illustrated in FIG. 8. FIG. 10 illustrates a timing diagram of an operation of the serializer of FIG. 8.

Referring to FIGS. 9 and 10, the serializer 5131 includes a plurality of stages (STG11, STG12 and STG13) 5131-1, 5131-2 and 5131-3. The plurality of stages 5131-1, 5131-2 and 5131-3 respectively operate based on the plurality of clock signals CLK2, CLK4 and CLK8. In some embodiments, a frequency of the clock signal CLK2 may be twice a frequency of the clock signal CLK1, a frequency of the clock signal CLK4 may be twice a frequency of the clock signal CLK2, and a frequency of the clock signal CLK8 may be twice a frequency of the clock signal CLK4.

The first stage 5131-1 receives parallel bits PA10, PA11, PA12, . . . , PA17, and merges the parallel bits PA10, PA11, PA12, . . . , PA17 based on the clock signal CLK2 to generate first intermediate parallel bits PA20, PA21, PA22 and PA23.

The second stage 5131-2 receives the first intermediate parallel bits PA20, PA21, PA22 and PA23, and merges the first intermediate parallel bits PA20, PA21, PA22 and PA23 based on the clock signal CLK4 to generate second intermediate parallel bits PA30 and PA31.

The third stage 5131-3 receives the second intermediate parallel bits PA30 and PA31, and merges the second intermediate parallel bits PA30 and PA 31 based on the clock signal CLK8 to generate serial bits SA. Therefore, the serializer 5131 sequentially merges the parallel bits PA10, PA11, PA12, . . . , PA17 and may finally output serial bits SA synchronized with the clock signal CLK8 having a frequency 8 times a frequency of the clock signal CLK1. For example, a first set of parallel bits PA10, PA11, PA12, PA13, PA14, PA15, PA16 and PA17 received at the first stage 5131-1 is provided from the third stage 5131-3 as the finally output serial bits 0, 1, 0, 1, 1, 0, 1, and 0.

Referring to FIGS. 8, 9 and 10, the plurality of stages 5131-1, 5131-2 and 5131-3 may receive the plurality of clock signals CLK2, CLK4 and CLK8, and sequentially serialize the parallel bits PA to output the serial bits SA according to the above-described method. In some embodiments, the parallel bits PA may be one of the test pattern data TP and the test result data TR. The parallel bits PA10, PA11, PA12, PA13, PA14, PA15, PA16 and PA17 described in FIG. 9. may be an example of the parallel bits PA.

The parallelizers 5100b and 5135 illustrated in FIG. 8 perform a function opposite to function of the serializer 5131 described above with reference to FIG. 9. The parallelizers 5100b and 5135 also include a plurality of stages, like the serializer 5131, and operate based on a plurality of clock signals. Since the configuration and operation of the parallelizers 5100b and 5135 are similar to those of the serializer 5131, detailed description will be omitted.

FIG. 11 illustrates a diagram descriptive of a data rate of data passing through the serializer or the parallelizer illustrated in FIG. 8.

In FIG. 11, data rates of parallel bits PA10, PA11, PA12, PA17 received by the serializer 5131 illustrated in FIG. 8, first intermediate parallel bits PA20, PA21, PA22 and PA23, second intermediate parallel bits PA30 and PA31, and serial bits SA generated by the serializer 5131 are illustrated.

As described above with reference to FIG. 6, when the semiconductor memory device according to example embodiments performs the wafer level tests, in a case of a function test, a data rate of data passing through various components included in the data input/output circuit 595 exceeds a maximum of 1000 Mbps.

Referring to FIG. 11, a data rate of parallel bits PA10, PA11, PA12, PA17 may be 150 Mbps, a data rate of the first intermediate parallel bits PA20, PA21, PA22 and PA23 may be 300 Mbps, a data rate of the second intermediate parallel bits PA30 and PA31 may be 600 Mbps, and a data rate of the serial bits SA may be 1200 Mbps. However, each data rate is merely exemplary, and the scope of example embodiments in not limited thereto.

Figure 12A:
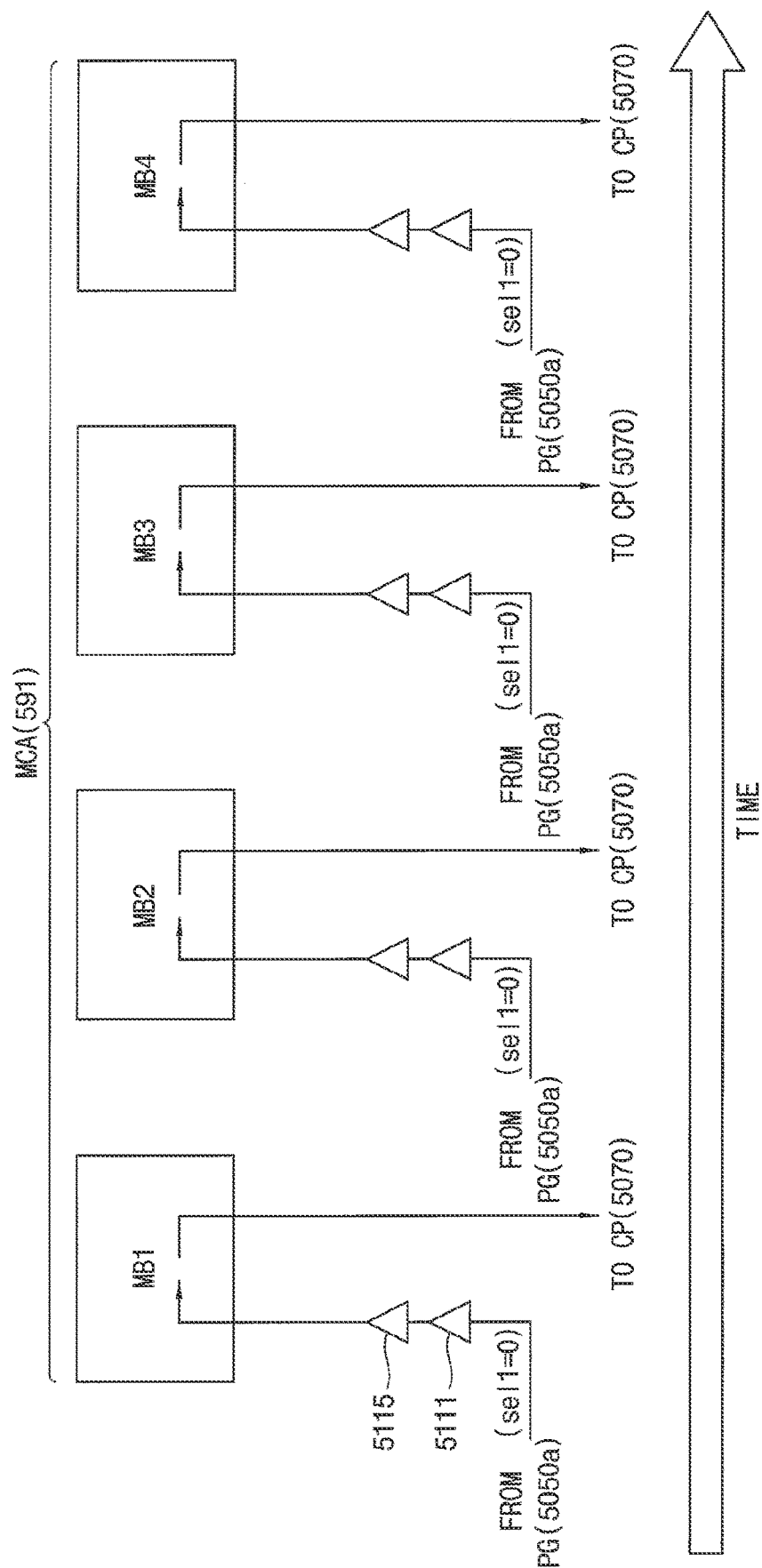
FIGS. 12A and 12B illustrate examples of a method of testing a semiconductor memory device illustrated of FIG. 8.
Figure 12B:
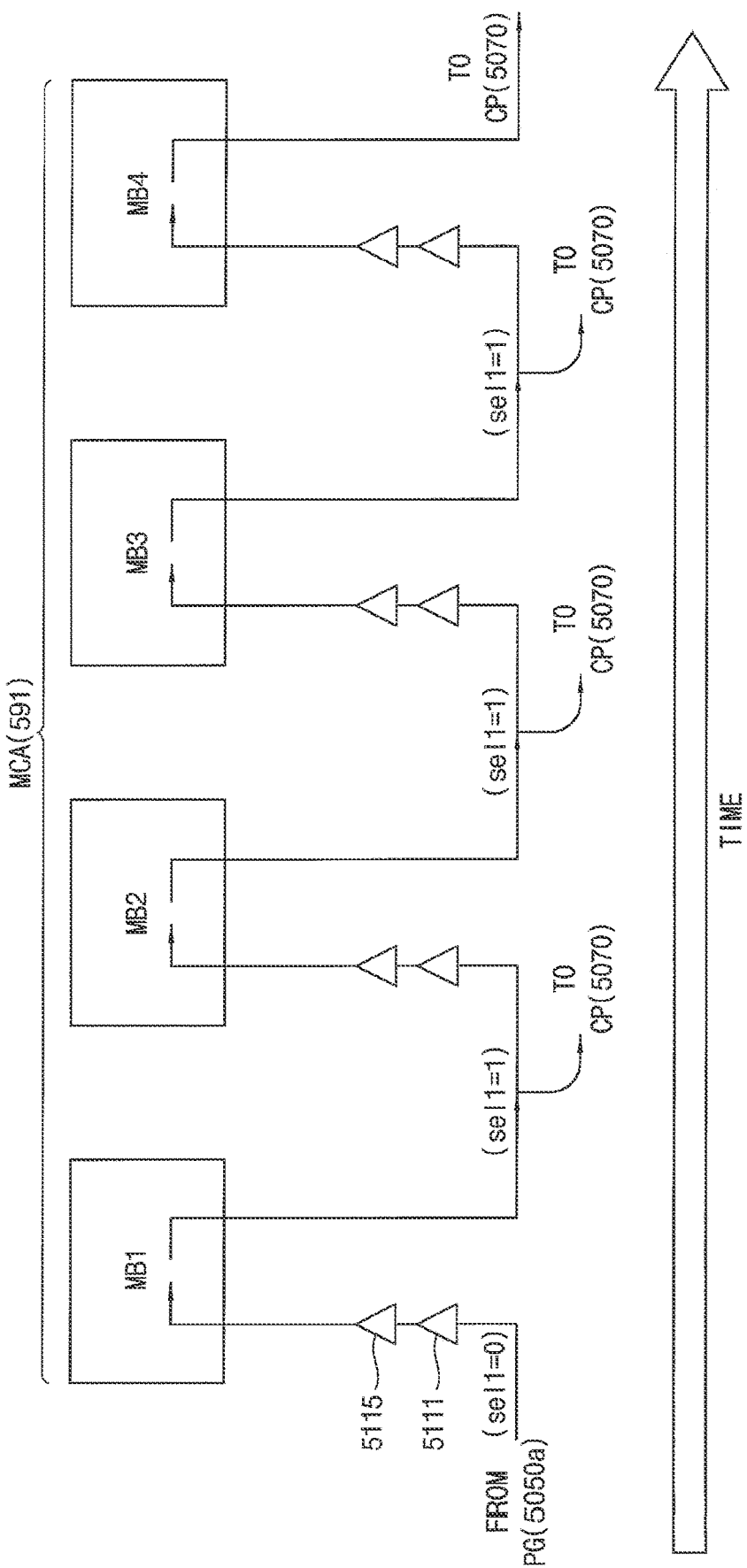

FIGS. 12A and 12B illustrate examples of a method of testing a semiconductor memory device of FIG. 8 according to embodiments of the inventive concepts.

In FIG. 12A, a memory cell array 591 includes a plurality of memory blocks MB1, MB2, MB3 and MB4. In some embodiments, each of the plurality of memory blocks MB1, MB2, MB3 and MB4 may include at least one cell string including a plurality of memory cells sequentially stacked on a substrate. A function test from among wafer level tests for a semiconductor memory device may be performed according to a test method illustrated in FIG. 12A. The number of the plurality of memory blocks MB1, MB2, MB3 and MB4 included in the memory cell array 591 is merely exemplary.

Referring to FIG. 12A, as time elapses, the function test for each of the first memory block MB1, the second memory block MB2, the third memory block MB3 and the fourth memory block MB4 may be sequentially performed.

When performing the function test on the first memory block MB1, the pattern generator 5050a may generate a first test pattern data (e.g., TP in FIG. 8), the first test pattern data may be provided to the first memory block MB1 through the output driver 5111 and the input buffer 5115, and a first test result data (e.g., TR in FIG. 8) generated from the first memory block MB1 may be provided to the comparison circuit 5070. When performing the function test on the second memory block MB2, the pattern generator 5050a may generate a second test pattern data, the second test pattern data may be provided to the second memory block MB2 through the output driver 5111 and the input buffer 5115, and a second test result data generated from the second memory block MB2 may be provided to the comparison circuit 5070. When performing the function test on the third memory block MB3, the pattern generator 5050a may generate a third test pattern data, the third test pattern data may be provided to the third memory block MB3 through the output driver 5111 and the input buffer 5115, and a third test result data generated from the third memory block MB3 may be provided to the comparison circuit 5070. When performing the function test on the fourth memory block MB4, the pattern generator 5050a may generate a fourth test pattern data, the fourth test pattern data may be provided to the fourth memory block MB4 through the output driver 5111 and the input buffer 5115, and a fourth test result data generated from the fourth memory block MB4 may be provided to the comparison circuit 5070.

In some embodiments, when performing the function test on each of the first to fourth memory blocks MB1, MB2, MB3 and MB4, the multiplexer illustrated in FIG. 8 may select one of the first test pattern data, the second test pattern data, the third test pattern data and the fourth test pattern data based on a selection signal sel1 (e.g., the selection signal sel1 is '0').

In an embodiment, each of the first test pattern data, the second test pattern data, the third test pattern data and the fourth test pattern data may be the same. However, the scope of the example embodiments is not limited thereto. In other embodiments, each of the first test pattern data, the second test pattern data, the third test pattern data and the fourth test pattern data may be different from each other. As another example, the first test pattern data and the third test pattern data may be the same test pattern data, and the second test pattern data and the fourth test pattern data may be the same test pattern data but however different than the first and third test pattern data.

In FIG. 12B, a memory cell array 591 includes a plurality of memory blocks MB1, MB2, MB3 and MB4. In some embodiments, each of the plurality of memory blocks MB1, MB2, MB3 and MB4 may include at least one cell string including a plurality of memory cells sequentially stacked on a substrate. A function test from among wafer level tests for a semiconductor memory device may be performed according to a test method illustrated in FIG. 12B. The number of the plurality of memory blocks MB1, MB2, MB3 and MB4 included in the memory cell array 591 is merely exemplary.

Referring to FIG. 12B, as time elapses, the function test for each of the first memory block MB1, the second memory block MB2, the third memory block MB3 and the fourth memory block MB4 may be sequentially performed.

When performing the function test on the first memory block MB1, the pattern generator 5050a may generate a first test pattern data (e.g., TP in FIG. 8), the first test pattern data may be provided to the first memory block MB1 through the output driver 5111 and the input buffer 5115, and a first test result data generated from the first memory block MB1 may be provided to the comparison circuit 5070.

When performing the function test on the second memory block MB2, the first test result data may be provided to the second memory block MB2 through the output driver 5111 and the input buffer 5115, and a second test result data (e.g., TR in FIG. 8) generated from the second memory block MB2 may be provided to the comparison circuit 5070.

When performing the function test on the third memory block MB3, the second test result data may be provided to the third memory block MB3 through the output driver 5111 and the input buffer 5115, and a third test result data generated from the third memory block MB3 may be provided to the comparison circuit 5070.

When performing the function test on the fourth memory block MB4, the third test result data may be provided to the fourth memory block MB4 through the output driver 5111 and the input buffer 5115, and a fourth test result data generated from the fourth memory block MB4 may be provided to the comparison circuit 5070.

In some embodiments, when performing the function test on each of the first to fourth memory blocks MB1, MB2, MB3 and MB4, the multiplexer 5151 illustrated in FIG. 8 may select one of the first test pattern data, the second test pattern data, the third test pattern data and the fourth test pattern data based on a selection signal sel1 (e.g., the selection signal sel1 is '0' when the function test is performed on the first memory block MB1 and the selection signal sel1 is '1' when the function test is performed on the second to fourth memory blocks MB2 to MB4).

Figure 13:
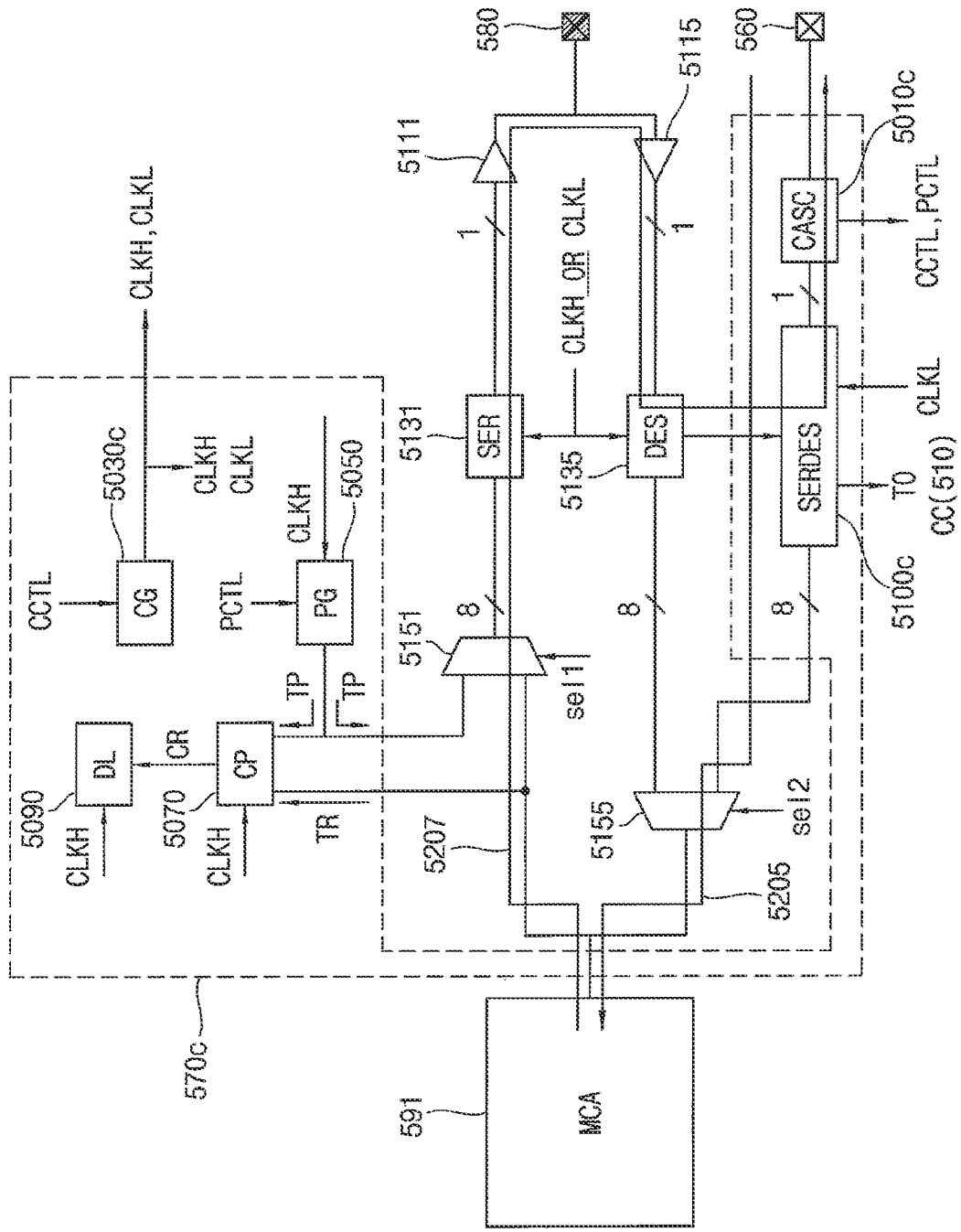
FIG. 13 illustrates a block diagram of a semiconductor memory device of FIGS. 3 and 5 according to embodiments of the inventive concepts.

FIG. 13 illustrates a block diagram of a semiconductor memory device of FIGS. 3 and 5 according to embodiments of the inventive concepts.

In the semiconductor memory device illustrated in FIG. 13, components having the same reference numerals as those included in the semiconductor memory devices illustrated in FIGS. 3 and 5 perform the same or similar functions, and thus duplicate description may be omitted from the following.

Referring to FIG. 13, the semiconductor memory device includes a memory cell array 591, a BIST circuit 570c, a first multiplexer 5151, a second multiplexer 5155, a serializer 5131, an output driver 5111, an input buffer 5115, a parallelizer 5135, a test pad 560 and a data input/output pad 580.

The BIST circuit 570b includes a clock generator 5030c, a pattern generator 5050, a comparison circuit 5070, determination logic 5090, a serializer/deserializer (SERDES) 5100c and a sampling circuit 5010c.

The semiconductor memory device illustrated in FIG. 13 may perform a DC test, an AC test and a function test from among the wafer level tests. Since a process of performing the function test by the semiconductor memory device is described above with reference to FIG. 8, a process of performing one of the DC test and the AC test of the semiconductor memory device illustrated in FIG. 13 will be described below. As described above with reference to FIG. 6, the test pad 560 is connected to the ATE 110, but the data input/output pad 580 has no connection relationship and does not perform a specific in performing the wafer level tests.

Referring to FIGS. 1, 5, 6, 8 and 13, the sampling circuit 5010c receives commands CMDs, addresses ADDRs and test pattern data from the ATE 110 through the test pad 560. Unlike a case in which the semiconductor memory device performs the function test, when performing one of the DC test and the AC test, the semiconductor memory device further receives the test pattern data from the ATE 110.

The sampling circuit 5010c samples at least one of the commands CMDs and addresses ADDRs to generate control signals PCTL and CCTL. The sampling circuit 5010c may provide the commands CMDs and the addresses ADDRs to the serializer/deserializer 5100c.

The serializer/deserializer 5100c receives the commands CMDs, the addresses ADDRs and the test pattern data, and receives a plurality of clock signals CLKL from the clock generator 5030c. The serializer/deserializer 5100c parallelizes the commands CMDs, addresses ADDRs and the test pattern data based on a plurality of clock signals CLKL.

The sampling circuit 5010c provides the commands CMDs and the addresses ADDRs to the control circuit 510 (see FIG. 3) and provides the test pattern data to the second multiplexer 5155.

The clock generator 5030c receives the control signal CCTL from the sampling circuit 5010 and generates a plurality of clock signals CLKH and CLKL having different frequencies with respect to each other based on the control signal CCTL. In some embodiments, the clock signal CLKH may include a plurality of clock signals CLK1, CLK2, CLK4 and CLK8 described above with reference to FIG. 9, and the clock signal CLKL may include a plurality of clock signals having a lower frequency than the clock signal CLKH to perform one of the DC test and the AC test.

In FIG. 13, a plurality of paths 5205 and 5207 are illustrated. The path 5205 represents a path in which the test pattern data is provided from the ATE 110 and written to the memory cell array 591, and the path 5207 represents a path in which the test result data is read from the memory cell array 591 and provided to the ATE 110. In some embodiments, the output driver 5111 and the input buffer 5115 may be included on the path 5207.

Figure 14A:
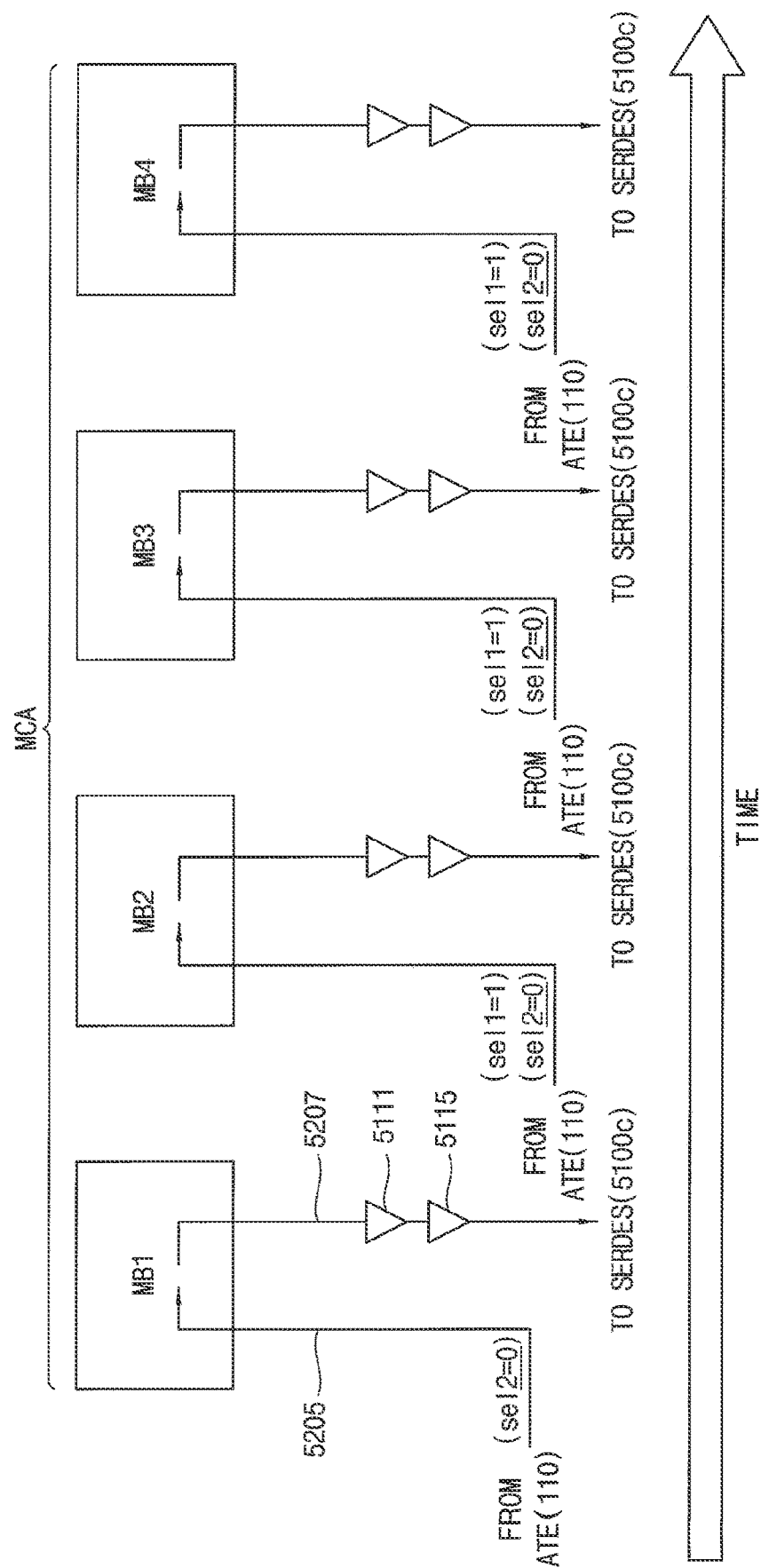

FIGS. 14A and 14B illustrate examples of a method of testing a semiconductor memory device of FIG. 13.

In FIG. 14A, a memory cell array 591 includes a plurality of memory blocks MB1, MB2, MB3 and MB4. One of a DC test and an AC test from among the wafer level tests for a semiconductor memory device may be performed according to the test method illustrated in FIG. 14A. The number of the plurality of memory blocks MB1, MB2, MB3 and MB4 included in the memory cell array 591 is merely exemplary.

Referring to FIG. 14A, as time elapses, one of the DC test and the AC test, hereinafter referred to as 'DC/AC test', for each of the first memory block MB1, the second memory block MB2, the third memory block MB3 and the fourth memory block MB4 may be sequentially performed.

When performing the DC/AC test on the first to fourth memory blocks MB1 to MB4, the ATE 110 may generate first to fourth test pattern data to provide the first to fourth test pattern data to the first to fourth memory blocks MB1 to MB4, respectively. The ATE 110 may receive first to fourth test result data from each of the first to fourth memory blocks MB1 to MB4.

In some embodiments, when performing the DC/AC test on each of the first to fourth memory blocks MB1, MB2, MB3 and MB4, the first multiplexer 5151 illustrated in FIG. 14A may select one of the first to fourth test result data based on a selection signal sel1 (e.g., the selection signal sel1 is '1'). The second multiplexer 5155 may select one of the first to fourth test pattern data based on a selection signal sel2 (e.g., the selection signal sel2 is '0').

In FIG. 14B, a memory cell array 591 includes a plurality of memory blocks MB1, MB2, MB3 and MB4. The DC/AC test among the wafer level tests for a semiconductor memory device may be performed according to the test method illustrated in FIG. 14B. The number of the plurality of memory blocks MB1, MB2, MB3 and MB4 included in the memory cell array 591 is merely exemplary.

Referring to FIG. 14B, as time elapses, the DC/AC test for each of the first memory block MB1, the second memory block MB2, the third memory block MB3 and the fourth memory block MB4 may be sequentially performed.

When performing the DC/AC test on the first to fourth memory blocks MB1 to MB4, the ATE 110 may generate only first test pattern data to provide the first pattern data to the first memory block MB1. The ATE 110 may receive first test result data from the first memory block MB1.

When performing the DC/AC test for the second to fourth memory blocks MB2 to MB4, as described above with reference to FIG. 12B, test result data from a previously tested memory block may function as test pattern data for a newly tested memory block.

In some embodiments, when performing the DC/AC test on the first memory block MB1, the second multiplexer 5155 illustrated in FIG. 14B may select the first test pattern data based on a selection signal sel2 (e.g., the selection signal sel2 is '0'). However, when performing the DC/AC test on the second to fourth memory blocks MB2 to MB4, the first and second multiplexers 5151 and 5155 illustrated in FIG. 14B may select test result data for a memory block previously tested based on selection signals sel1 and sel2 (e.g., the selection signals sel1 and sel2 are '1').

Figure 15:
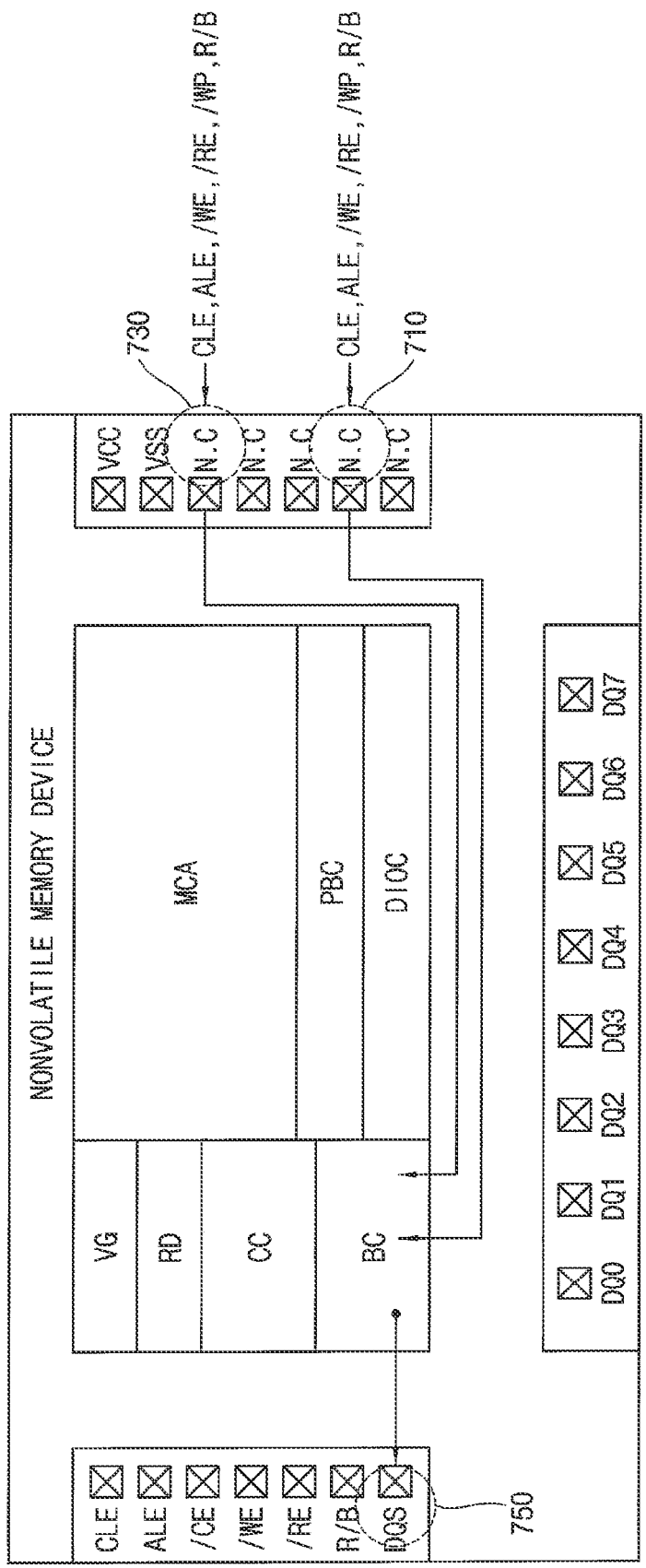
FIG. 15 illustrates a diagram of an example of a connection relationship between a built-in self test (BIST) circuit and a test pad included in a semiconductor memory device according to embodiments of the inventive concepts.

FIG. 15 illustrates a diagram of a connection relationship between a BIST circuit and a test pad included in a semiconductor memory device 700 according to embodiments of the inventive concepts.

Referring to FIG. 15, a semiconductor memory device includes control circuit (CC) 510, voltage generator (VG) 530, read decoder (RD) 550, test pad 560, BIST circuit (BC) 570, data input/output pad 580, and memory core 590 including memory cell array (MCA) 591, page buffer circuit (PBC) 593 and data input/output circuit (DIOC) 595 described above with reference to FIG. 3.

Figure 16:
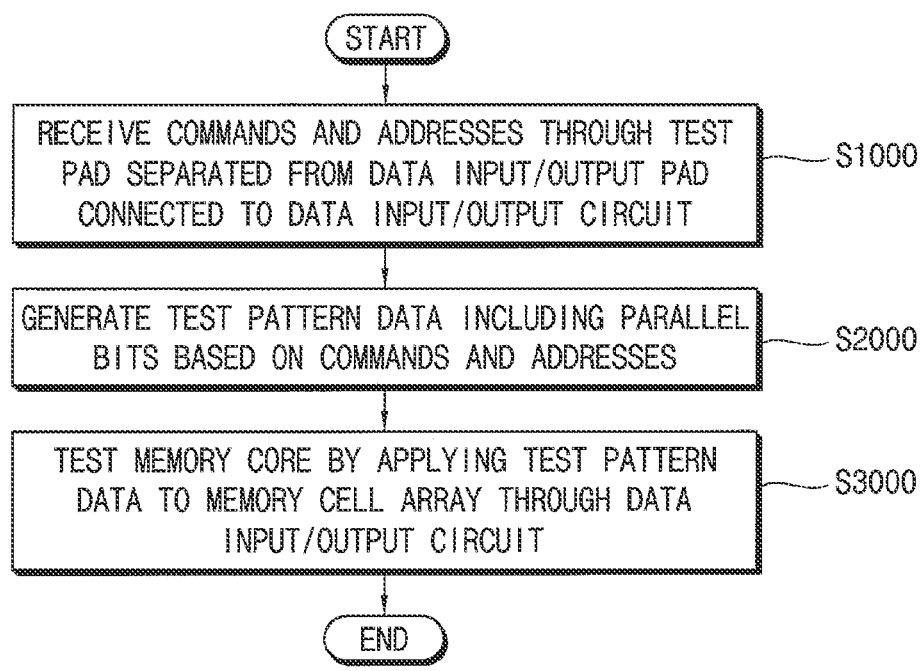
FIG. 16 illustrates a flowchart of a method of testing a semiconductor memory device according to embodiments of the inventive concepts.

In some embodiments, the data input/output pad 580 may be the data input/output pads DQ0 to DQ7 illustrated in FIG. 15, and the test pad 560 may be a portion of non-connected pads (NC) (e.g., 710 and 730) illustrated in FIG. 16.

In FIG. 15, the two test pads (e.g., 710 and 730) are illustrated, but the number of the test pads is merely exemplary. That is, the test pad may be only one of the non-connected pads illustrated in FIG. 15. In some embodiments, the BIST circuit BC may provide commands CMDs and addresses ADDRs received through the test pad to the control circuit CC through a data strobe pad (DQS) 750.

FIG. 16 illustrates a flowchart of a method of testing a semiconductor memory device according to embodiments of the inventive concepts.

Referring to FIG. 16, in a method of testing a semiconductor memory device, the semiconductor memory device included in each of a plurality of chips divided by a scribe lane and formed on an upper surface of a wafer is tested.

In the method of testing the semiconductor memory device, commands and addresses are received from outside through a test pad separated from a data input/output pad that is connected to a data input/output circuit (S1000). Test pattern data including parallel bits is generated based on the commands and the addresses (S2000). Then, the test pattern data is applied to a memory cell array through the data input/output circuit to test a memory core (S3000).

Figure 17:
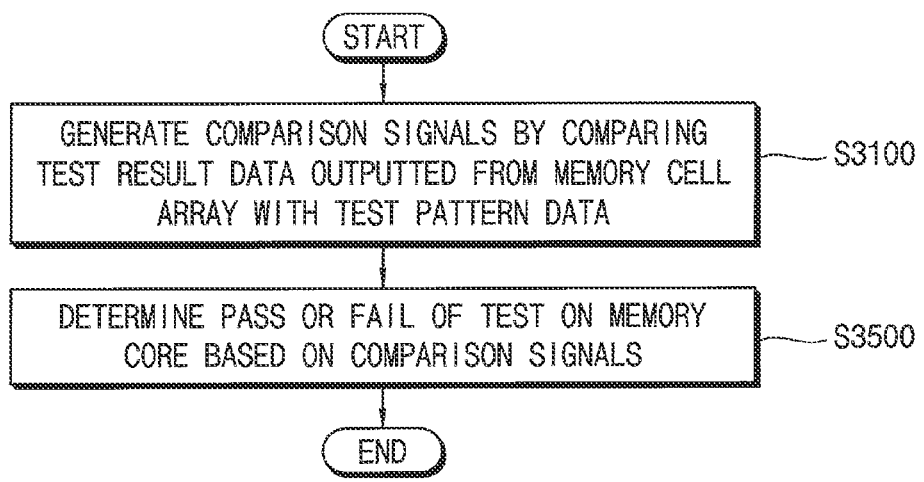
FIG. 17 illustrates a flowchart of an example of testing a memory core in FIG. 16.

FIG. 17 illustrates a flowchart of testing a memory core (S3000) in FIG. 16 according to embodiments of the inventive concepts.

Referring to FIG. 17, in response to test pattern data, comparison signals are generated by comparing test result data outputted from a memory cell array with test pattern data (S3100). Pass or fail of a test on the memory core is determined based on the comparison signals (S3500).

Figure 18:
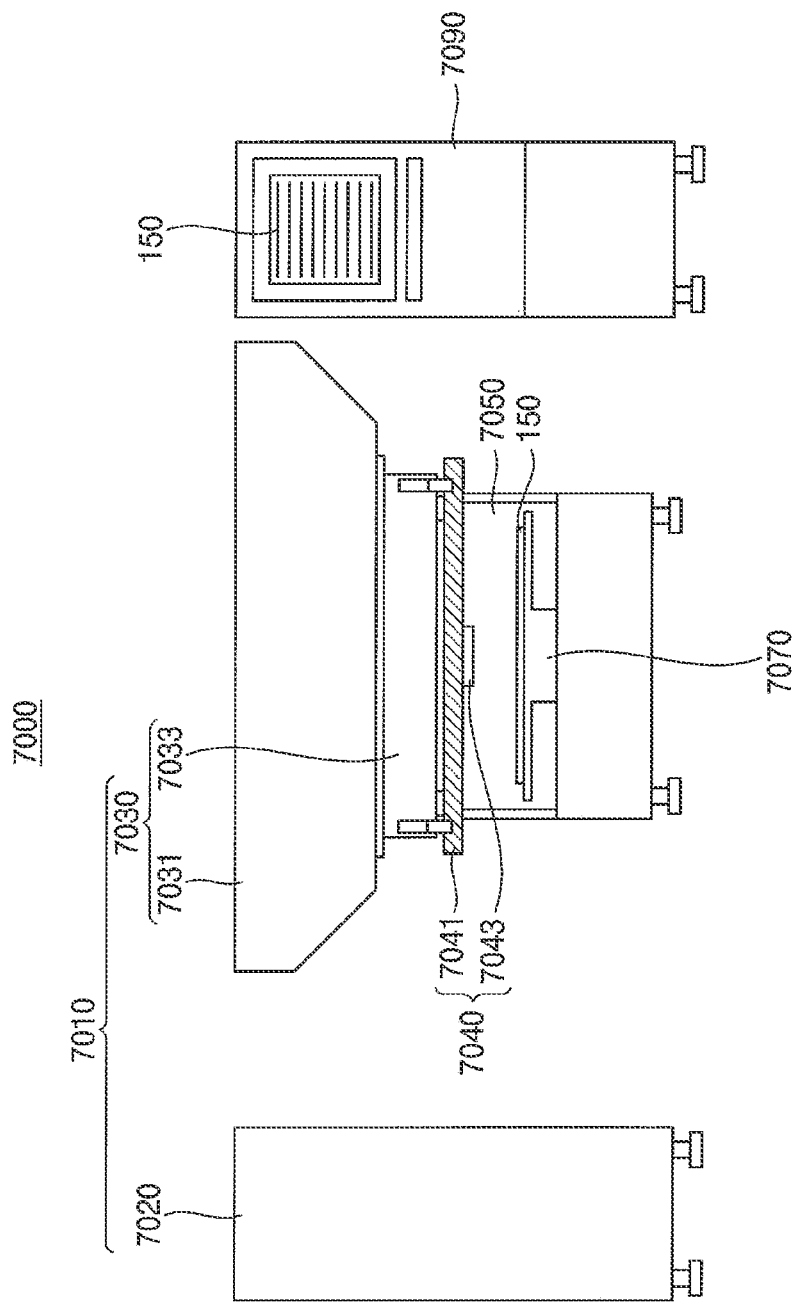
FIG. 18 illustrates a diagram of a test system according to embodiments of the inventive concepts.

FIG. 18 illustrates a diagram of a test system according to e embodiments of the inventive concepts.

Referring to FIG. 18, a test system 7000 includes a probe card 7040, a test chamber 7050, an ATE 7010 and a loader chamber 7090. The ATE 7010 includes a test head 7030 and a test body 7020, and the test head 7030 and the test body 7020 are electrically connected through an electric wire or the like (not shown). The probe card 7040 may include a substrate 7041 and a probe unit 7043.

The test chamber 7050 provides a space for testing electrical properties of chips, and a wafer supporting chuck 7070 may perform a function of moving up and down while supporting the wafer 150.

The test head 7030 may include a test head board 7031 and a base 7033. The base 7033 is disposed on the lower surface of the test head board 7031, may have a ring shape in which the center portion is vacant, and the probe card 7040 may be coupled to a lower surface of the base 7033.

The test body 7020 may generate an electrical signal for testing the chips, and may transmit the electrical signal to the chips in the wafer 150 via the test head 7030 and the probe card 7040. Also, the test body 7020 may receive output signals outputted from each chip in response to electrical signals transmitted to each chip via the probe card 7040 and the test head 7030, and thus determine whether or not each of the chips is faulty.

The loader chamber 7090 is a space for storing the wafers 150 to be tested. In order to be tested, the wafers 150 stored in the loader chamber 590 may be transferred one by one to the wafer supporting chuck 7070 of the test chamber 7050 by a moving device (not shown).

In further embodiments of the inventive concepts, semiconductor memory devices such as for example the semiconductor memory device 500 shown in FIG. 3 may be formed in each of a plurality of chips 300 an upper surface of a wafer 150 such as shown in FIG. 2 for example. The semiconductor memory devices may then be tested using the testing described with reference to FIGS. 1-18.

As described above, a semiconductor memory device, a method of testing the semiconductor memory device and a test system of the inventive concepts performs wafer level tests through a test pad that is separate from a data input/output pad connected to a data input/output circuit. As a result, since a load effect generated by automatic test equipment does not affect an input buffer and an output driver that may be a target of the wafer level tests, the wafer level test may be performed at high speed. Further, the semiconductor memory device and the test system include a serializer/deserializer connected to the test pad. The serializer/deserializer performs serial-parallelization on data input/output through the test pad, and thereby enables the wafer level tests to be performed using a single test pad.

The semiconductor memory device, the method of testing the semiconductor memory device and the test system may be used for testing of general semiconductor memory devices. The foregoing is illustrative of example embodiments and is not to be construed as limiting thereof. Although example embodiments have been described, those skilled in the art will readily appreciate that many modifications are possible in the example embodiments without materially departing from the novel teachings and advantages of the inventive concepts. Accordingly, all such modifications are intended to be included within the scope of the inventive concepts as defined in the claims.

What is claimed is:

1. A semiconductor memory device comprising:
   a memory core including a data input/output circuit connected to a data input/output pad that is configured to receive data, and a memory cell array configured to store the data; and
   a built-in self test (BIST) circuit connected to a test pad that is disposed separate from the data input/output pad, the BIST circuit configured to generate test pattern data including first parallel bits based on commands and addresses received from external automatic test equipment (ATE) through the test pad during a wafer level test process performed on the semiconductor memory device, and configured to test the memory core by applying the test pattern data to the memory cell array through the data input/output circuit,
   wherein the semiconductor memory device is disposed in a chip from among a plurality of chips that are on a surface of a wafer and that are separated from each other by a scribe lane,
   wherein the data input/output circuit comprises
      an output driver connected to the BIST circuit and the data input/output pad, and
      an input buffer connected to the data input/output pad, the output driver and the memory cell array,
   wherein the BIST circuit is further configured to test the output driver and the input buffer by applying the test pattern data to the memory cell array through the output driver and the input buffer, and the memory cell array outputs test result data responsive to the test pattern data, and
   wherein the data input/output circuit further comprises a multiplexer configured to select and provide one of the test pattern data and the test result data to the output driver in response to a first selection signal.

2. The semiconductor memory device of claim 1, wherein the BIST circuit comprises:
   a pattern generator configured to generate the test pattern data in response to the commands and the addresses;
   a comparison circuit configured to generate comparison signals by comparing the test result data with the test pattern data; and
   determination logic configured to determine pass or fail of a test on the memory core based on the comparison signals.

3. The semiconductor memory device of claim 2, wherein the BIST circuit further comprises:
- a clock generator configured to generate a plurality of clock signals having respective different frequencies; and
- a sampling circuit configured to receive the commands and the addresses, and to output a first control signal associated with controlling the pattern generator and a second control signal associated with controlling the clock generator by sampling at least one of the commands and the addresses.

4. The semiconductor memory device of claim 3, wherein each of the commands and the addresses received through the test pad includes serial bits, and
- wherein the BIST circuit further comprises a parallelizer configured to parallelize the serial bits of each of the commands and the addresses to output second parallel bits.

5. The semiconductor memory device of claim 1, wherein the data input/output circuit further comprises:
- a serializer configured to serialize the first parallel bits of the test pattern data based on a plurality of clock signals provided from the BIST circuit to provide first serial bits having a first data rate; and
- a parallelizer configured to output second parallel bits having a second data rate by parallelizing the first serial bits based on the plurality of clock signals.

6. The semiconductor memory device of claim 5, wherein the parallelizer is configured to provide the second parallel bits to the memory cell array as the test pattern data.

7. The semiconductor memory device of claim 5, wherein the first data rate is greater than the second data rate.

8. The semiconductor memory device of claim 5, wherein the serializer comprises a plurality of stages,
- wherein the plurality of stages are configured to receive the plurality of clock signals, and to sequentially serialize the test pattern data to output the first serial bits, and
- wherein the plurality of clock signals have different frequencies.

9. The semiconductor memory device of claim 5, wherein the serializer comprises:
- a first stage configured to generate first intermediate parallel bits by merging the first parallel bits based on a first clock signal from among the plurality of clock signals;
- a second stage configured to generate second intermediate parallel bits by merging the first intermediate parallel bits based on a second clock signal from among the plurality of clock signals; and
- a third stage configured to generate the first serial bits by merging the second intermediate parallel bits based on a third clock signal from among the plurality of clock signals.

10. The semiconductor memory device of claim 9, wherein a frequency of the second clock signal is twice a frequency of the first clock signal, and wherein a frequency of the third clock signal is twice the frequency of the second clock signal.

11. The semiconductor memory device of claim 1, wherein the memory cell array includes a plurality of memory blocks, and each of the memory blocks includes at least one cell string that includes a plurality of memory cells sequentially stacked on a substrate, and
- wherein the BIST circuit is configured to sequentially test each of the plurality of memory blocks.

12. The semiconductor memory device of claim 11, wherein when the BIST circuit initially tests a first memory block from among the plurality of memory blocks, the multiplexer is configured to select the test pattern data, and
- when the BIST circuit tests a second memory block different from the first memory block after completion of testing the first memory block, the multiplexer is configured to select the test result data.

13. The semiconductor memory device of claim 1, wherein the BIST circuit is configured to test the memory core with respect to a plurality of test items in each of a plurality of test modes, to receive the commands and the addresses from the external ATE in a first test mode from among the plurality of test modes, and to receive the commands, the addresses and external test pattern data from the external ATE in a second test mode from among the plurality of test modes.

14. The semiconductor memory device of claim 13, wherein the multiplexer is further configured to select one of the external test pattern data and test result data output from the memory cell array in response to the external test pattern data in the second test mode.

15. The semiconductor memory device of claim 14, wherein the first test mode designates a function test from among wafer level tests for the semiconductor memory device, and the second test mode designates one of a direct current (DC) test and an alternating current (AC) test from among the wafer level tests for the semiconductor memory device.

16. The semiconductor memory device of claim 15, wherein the BIST circuit further comprises a serializer/deserializer (SERDES) configured to receive and parallelize the commands, the addresses and the external test pattern data in the second test mode, and to serialize the test result data output from the memory cell array.

17. A method of testing semiconductor memory devices comprising:
- receiving commands and addresses from outside through a test pad separated from data input/output pads that are connected to data input/output circuits of the semiconductor memory devices, the data input/output pads receive data for storage in the semiconductor memory devices;
- generating test pattern data including parallel bits based on the commands and the addresses; and
- testing memory cores of the semiconductor memory devices by applying the test pattern data to memory cell arrays of the memory cores through the data input/output circuits, wherein the memory cell arrays include a plurality of memory blocks,
- wherein the testing comprises
    - selecting one of the test pattern data and test result data in response to a first selection signal, the test result data output from one of the memory cell arrays in response to the test pattern data,
    - when initially testing a first memory block from among the plurality of memory blocks of the one of the memory cell arrays, selecting the test pattern data, and
    - when testing a second memory block from among the plurality of memory blocks of the one of the memory cell arrays different from the first memory block after completion of testing the first memory block, selecting the test result data, and wherein the semiconductor memory devices are included in each of a plurality of chips that are on an upper surface of a wafer and that are separated from each other by a scribe lane.

18. The method of claim 17, wherein the testing the memory cores comprises:
generating comparison signals by comparing test result data with the test pattern data, the test result data output from the memory cell arrays in response to the test pattern data; and
determining pass or fail of tests of the memory cores based on the comparison signals.

19. A test system comprising:
automatic test equipment (ATE) configured to generate commands and addresses in a first test mode of a wafer level test performed on a semiconductor memory device included in a chip from among a plurality of chips that are on an upper surface of a wafer, and to generate the commands, the addresses and external test pattern data in a second test mode of the wafer level test,
the semiconductor memory device comprising
a memory core including a data input/output circuit connected to a data input/output pad that is configured to receive data, and a memory cell array configured to store the data, and
a built-in self test (BIST) circuit connected to a test pad that is separated from the data input/output pad,
wherein the BIST circuit is configured to generate test pattern data including parallel bits responsive to the commands and the addresses received from the ATE through the test pad in the first test mode, and
the BIST circuit is configured to receive the commands, the addresses and the external test pattern data through the test pad, and to test the memory core by applying one of the test pattern data and the external test pattern data to the memory cell array through the data input/output circuit in the second test mode.

* * * * *